(12) United States Patent
Miya et al.

(10) Patent No.: US 6,337,000 B1
(45) Date of Patent: Jan. 8, 2002

(54) GUIDE BUSH AND METHOD OF FORMING DIAMOND-LIKE CARBON FILM OVER THE GUIDE BUSH

(75) Inventors: Yukio Miya, Kawagoe; Osamu Sugiyama; Ryota Koike, both of Tokorozawa; Takashi Toida, Tokyo, all of (JP)

(73) Assignee: Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 09/671,366

(22) Filed: Sep. 28, 2000

Related U.S. Application Data

(62) Division of application No. 09/299,729, filed on Apr. 27, 1999, now Pat. No. 6,264,209.

(30) Foreign Application Priority Data

Apr. 28, 1998 (JP) ............................................ 10-118477
Jun. 18, 1998 (JP) ............................................ 10-170776

(51) Int. Cl.[7] ............................ C23C 14/34; H05H 1/24
(52) U.S. Cl. ............................ 204/192.15; 204/192.12; 427/569; 427/577; 427/307
(58) Field of Search ....................... 204/192.12, 192.15; 427/569, 577, 307

(56) References Cited

U.S. PATENT DOCUMENTS

| | | | |
|---|---|---|---|
| 5,391,422 A | 2/1995 | Omori et al. ............... | 428/212 |
| 5,560,839 A | 10/1996 | Bennett et al. ............. | 216/100 |
| 5,650,059 A | 7/1997 | Shumaker et al. .......... | 205/640 |
| 5,731,045 A | 3/1998 | Dearnaley et al. .......... | 427/527 |

FOREIGN PATENT DOCUMENTS

| | | | |
|---|---|---|---|
| EP | 813923 | 12/1997 | |
| JP | 62-67174 | 3/1987 | ........... C23C/16/02 |
| JP | 4-141303 | 5/1992 | ........... B23B/13/02 |

OTHER PUBLICATIONS

Appln. Serial No. 08/913,187 filed Sep. 8, 1997 by Miya et al, for "Guide Bush and Method of Forming Hard Carbon Film over the Inner . . . ".

Primary Examiner—Nam Nguyen
Assistant Examiner—Steven H. VerSteeg
(74) Attorney, Agent, or Firm—Armstrong, Westerman, Hattori, McLeland & Naughton LLP

(57) ABSTRACT

The invention provides a guide bush wherein a cemented carbide alloy containing at least cobalt is provided on an inner surface thereof for holding a workpiece rotatably and slidably in the longitudinal axial direction thereof in close proximity of a cutting tool, and a DLC film is formed over the cemented carbide alloy, cobalt being removed from the surface of the cemented carbide alloy, adjoining the DLC film. By forming the DLC film 15 on the surface of the cemented carbide alloy 12 from which cobalt has been removed, with an intermediate layer formed therebetween, adhesiveness of the DLC film against the cemented carbide alloy fixedly attached to the inner surface of the guide bush is further enhanced.

12 Claims, 12 Drawing Sheets

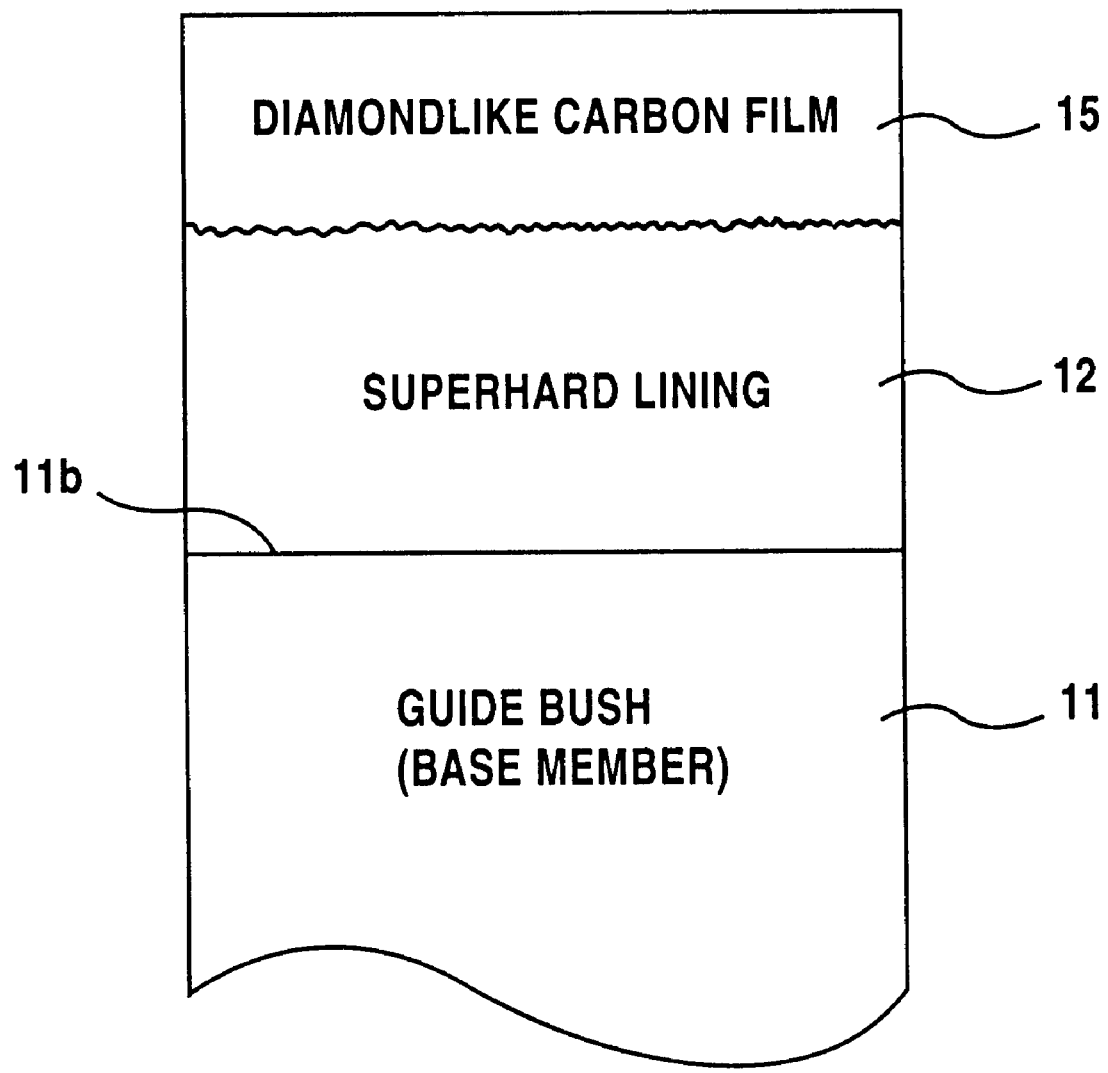

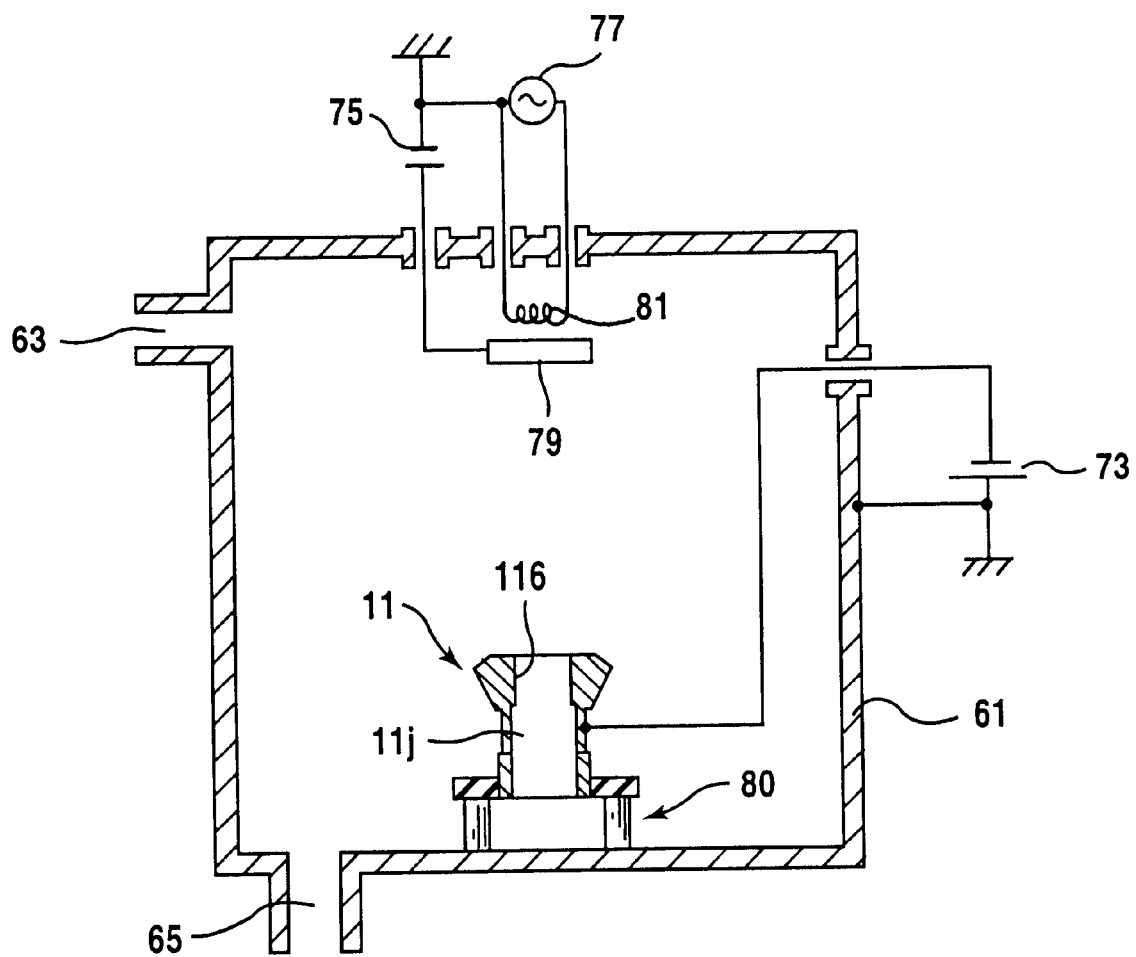

GUIDE BUSH AND METHOD OF FORMING DIAMOND-LIKE CARBON FILM OVER THE GUIDE BUSH

This application is a division of prior application Ser. No. 09/299,729 filed Apr. 27, 1999 now U.S. Pat. No. 6,264,209.

BACKGROUND OF THE INVENTION

1. Field of the Invention

The present invention relates to a structure of a guide bush mounted on a column of an automatic lathe to support a workpiece for rotation and sliding, and a method of forming a diamond-like carbon film over the inner circumference of the guide bush.

2. Description of the Related Art

A guide bush is a component mounted on a column of an automatic lathe to support a workpiece for rotation and sliding.

Further explaining about the guide bush in detail, it is in an approximate cylindrical form having a center bore formed along its center axis, including a taper outer surface formed on one longitudinal end portion and provided with slits to make the end portion elastic, a threaded portion formed on another end portion to be mounted on a column of an automatic lathe, and an inner surface for holding a workpiece inside a portion in which the taper outer surface is formed, mounted on an automatic lathe so as to hold a workpiece inserted into the center bore with the inner surface so that the workpiece can rotate and axially slide at a portion near a cutting tool.

Therefore, the inner surface of the guide bush always contacts and rotates with a workpiece, and a workpiece rotates and axially slides on the inner surface. Thus, the inner surface of the guide bush supporting a workpiece can be abraded easily.

So, a guide bush is proposed in JP-A No. 4-141303 which has an inner surface, which is in contact with a workpiece because of rotation and sliding, coated with a cemented carbide alloy or a ceramic.

When the inner circumference of a guide bush is provided with a cemented carbide alloy or a ceramic excellent in abrasion resistance and heat resistance, the abrasion of the inner surface of the guide bush can be reduced to some extent.

However, even when the guide bush is used on an automatic lathe, there was problems because of a large coefficient of friction and a low thermal conductivity of the cemented carbide alloy and the ceramic, that the workpiece is damaged or seizing occurs due to decrease in the diametrical clearance between the guide bush and the workpiece in case of heavy machining in which the depth of cut is large and the cutting speed is high.

Thus, it is proposed that the cemented carbide alloy provided on the inner surface of the guide bush is covered with a diamond-like carbon film to reduce abrasion of the inner surface.

The diamond-like carbon film is a black coating, and is a hard carbon film having properties close to those of diamond. The diamond-like carbon film has excellent properties of high mechanical hardness, a low coefficient of friction, good electric insulation, and high corrosion-resistance.

So, it enables the guide bush to improve abrasion resistance dramatically and to avoid seizing that the surface of the cemented carbide alloy on the inner surface of the guide bush is covered with the diamond-like carbon film.

Incidentally, the diamond-like carbon film is a hydrogenated amorphus carbon film and generally called diamond-like carbon film (abbreviated as "DLC film") because of above-described diamond-like properties, and also called i-carbon film.

DLC Film Forming Method on a Guide Bush According to a Conventional Art: FIG. 16

A method of forming DLC film over an inner surface of a guide bush, according to the conventional art will be described referring to FIG. 16 hereinafter.

As shown in FIG. 16, a guide bush 11 on which DLC film will be formed is mounted in a vacuum vessel 61 which comprises of a gas inlet port 63 and a gas outlet port 65. The guide bush 11 is quenched and tempered after an outer form and an inner form thereof are made up with an alloy tool steel (SK steel). And a cemented carbide alloy is provided on the inner surface 11b of the guide bush 11.

A DC voltage is applied to the guide bush 11 by a DC power source 73, a positive DC voltage is applied to the anode 79 disposed in the vacuum vessel 61 opposite the guide bush 11 by an anode power source 75, and an AC voltage is applied to the filament 81 by a filament power source 77.

Further, the vacuum vessel 61 is evacuated by an evacuating means which is not shown through the gas outlet port 65, and gas containing carbon is introduced through the gas inlet port 63. Thus, plasma is produced in the vacuum vessel 61 to form DLC film on the surface of the guide bush 11 containing the inner surface 11b thereof.

In the case of the method of forming DLC film with the unit shown in FIG. 16, plasma caused by the DC voltage applied to the guide bush 11, and plasma caused by the filament 81 to which the AC voltage is applied and the anode 79 to which the DC voltage is applied, is produced.

Then, according to the pressure in the vacuum vessel 61 at the time the DLC film is formed, either the plasma around the guide bush 11 or the plasma beside the filament 81 and the anode 79 becomes a main source of forming DLC film.

In the case of the above-described conventional DLC film forming method, the plasma which is produced in a portion around the guide bush 11 becomes a main source of decomposing the gas containing carbon and forming DLC film when the pressure in the vacuum vessel 61 is above $3 \times 10^{-3}$ torr.

Then, it is possible to form DLC film on the outer surface of the guide bush 11, but the DLC film formed on the inner surface of the center bore 11j is poor at adhesion, and properties thereof, hardness or the like, are also poor.

This is caused by that the same electrical potential is applied to the guide bush 11, the inside of the center bore 11j becomes a space where electrodes having the same potential are opposite to each other, and the plasma in the center bore 11j causes abnormal discharge called hollow discharge.

The DLC film formed by this hollow discharge is polymer-like and poor at adhesion. Thus it flakes off easily from the inner surface 11b of the guide bush 11, and the hardness thereof is low.

On the other hand, the plasma produced beside the filament 81 and the anode 79 contributes to the forming of DLC film more than the plasma around the guide bush 11 when the pressure in the vacuum vessel 61 is below $3 \times 10^{-3}$ torr.

In this case, it is possible to form DLC film uniformly on the outer surface of the guide bush 11, but it is not possible in the direction of the length on the inner surface of the center bore 11j of the guide bush 11.

Here, carbon ions ionized by the plasma produced beside the filament 81 and the anode 79 pile up pulled by the negative DC potential applied to the guide bush 11, and form DLC film.

DLC film is formed by chemical vapor deposition process when the above-described pressure in the vacuum vessel 61 is above $3\times10^{-3}$ torr. But it is formed by physical vapor deposition process when the pressure is below $3\times10^{-3}$ torr.

Thus, when DLC film is formed under the contribution of the plasma produced beside the filament 81 and the anode 79, the thickness of the DCL film on the inner surface of the center bore 11j of the guide bush 11 decreases with the distance from the open end.

As a result, it is impossible to form DLC film in uniform thickness in the direction of the length of the guide bush 11 on the inner surface 11b thereof.

Further, in the case of the guide bush on which the above-described conventional DLC film is formed, a cemented carbide alloy made of alloy tool steel (SK steel) is provided on the inner surface of the guide bush base, and DLC film is formed on the surface of the cemented carbide alloy. G-2 (Japanese Industrial Standards: JIS) is frequently used as the cemented carbide alloy.

Generally used chemical composition of the G-2 (JIS) is 87–90% of tungsten (W), 5–7% of carbon (C) and 5–7% of cobalt (Co) as a binder.

When DLC film is directly formed on the cemented carbide alloy of this composition, the DLC film can not be formed with good adhesion, and the problem that it easily peels off occurs.

SUMMARY OF THE INVENTION

It is therefore an object of the present invention to provide a guide bush having excellent durability, and to provide a method of forming a DLC film whereby the DLC film can be formed with good adhesiveness to a uniform thickness over a cemented carbide alloy, provided on the inner surface of the guide bush, for holding a workpiece, by solving such problems as described in the foregoing.

With the guide bush according to the invention, the inner surface thereof described above for holding the workpiece rotatably and slidably is provided with the cemented carbide alloy containing at least cobalt, and the DLC film is formed over the cemented carbide alloy. And in order to achieve the object described above, the invention provides the guide bush wherein cobalt contained in the surface of the cemented carbide alloy, adjoining the DLC film, has been removed.

Further, marks caused by a grinding process applied are preferably removed from the surface of the cemented carbide alloy, adjoining the DLC film. And the surface of the cemented carbide alloy, adjoining the DLC film, is preferably not specular, but rough.

The invention also provides a guide bush wherein a DLC film is formed on the surface of the cemented carbide alloy described above, from which cobalt contained has been removed, with an intermediate layer interposed therebetween.

The intermediate layer can be formed of an alloy containing carbon as a constituent material thereof.

The intermediate layer can also be made up of a plurality of films, each made of a different material.

The intermediate layer is preferably made up of a first intermediate layer made of titanium or chromium, formed directly over the cemented carbide alloy, and a second intermediate layer made of silicon or germanium, formed over the first intermediate layer.

A method of forming the DLC film in a guide bush according to the invention comprises the following steps:

(1) a step of removing cobalt contained in the surface of the cemented carbide alloy by etching;

(2) a step of placing the guide bush in a vacuum vessel with an electrode inserted inside the center bore of the guide bush; and (3) a step of forming the DLC film on the surface of the cemented carbide alloy formed on the inner surface of the guide bush by evacuating the vacuum vessel before introducing a gas containing carbon therein, and by causing a plasma to be generated inside the center bore of the guide bush by applying a DC voltage or RF electric power to the guide bush while keeping the electrode grounded.

A method of forming the DLC film over a guide bush according to the invention may also comprise the following steps:

(1) a step of removing cobalt contained in the surface of the cemented carbide alloy by etching;

(2) a step of forming an intermediate layer made of a constituent material of a target on the surface of the cemented carbide alloy by means of a sputtering method after placing the guide bush and the target in a vacuum vessel such that the center bore of the guide bush is disposed opposite to the target and evacuating the vacuum vessel before introducing argon gas thereinto, (3) a step of disposing the guide bush in the vacuum vessel with the intermediate layer formed on the guide bush such that an electrode is inserted inside the center bore thereof; and (4) a step of forming the DLC film on the surface of the intermediate layer formed on the inner surface of the guide bush by evacuating the vacuum vessel before introducing a gas containing carbon therein, and causing a plasma to be generated inside the center bore by applying a DC voltage or RF electric power to the guide bush while keeping the electrode grounded.

In the step of forming the DLC film as described above, instead of grounding the electrode, a positive DC voltage may be applied thereto.

In the step of removing cobalt contained in the surface of the cemented carbide alloy by etching as described above, cobalt is preferably removed by wet etching.

The wet etching can be executed in a blended solution of sodium hydroxide and aqueous hydrogen peroxide.

In the step of forming the intermediate layer as described above, an alloy composed of tungsten and carbon mixed together at a ratio of 1 to 1 can be used as a constituent material for the target, thereby forming the intermediate layer made up of a tungsten carbide film on the surface of the cemented carbide alloy.

In the step of forming the intermediate layer as described above, a first intermediate layer made up of a titanium film or chromium film may be formed on the surface of the cemented carbide alloy by using titanium or chromium as a target before forming a second intermediate layer made up of a silicon film or a germanium film over the first intermediate layer by replacing the target with silicon or germanium.

In the step of forming the DLC film on the surface of the cemented carbide alloy or the surface of the intermediate layer, the gas containing carbon, introduced in the vacuum vessel, is preferably benzene or methane.

The above and other objects, features and advantages of the invention will be apparent from the following detailed description which is to be read in conjunction with the accompanying drawings.

BRIEF DESCRIPTION OF THE DRAWINGS

FIG. 12 is a graph showing a correlation between voltage applied to an electrode inserted in the center bore of the guide bush and thickness of the DLC film formed in carrying out the method of forming the DLC film in the guide bush according to the invention as shown in FIGS. 9 to 11;

FIG. 13 is a schematic sectional view for illustrating the embodiment of the method of forming the DLC film in the guide bush according to the invention, showing an example of steps of forming an intermediate layer;

FIG. 16 is a schematic sectional view for illustrating a conventional method of forming a DLC film in a guide bush.

DETAILED DESCRIPTION OF THE PREFFERED EMBODIMENTS

Structures of guide bushes according to the present invention and preferred embodiments of diamond-like carbon film forming method on the guide bush will be concretely described referring to figures, hereinafter.

Figure 14:
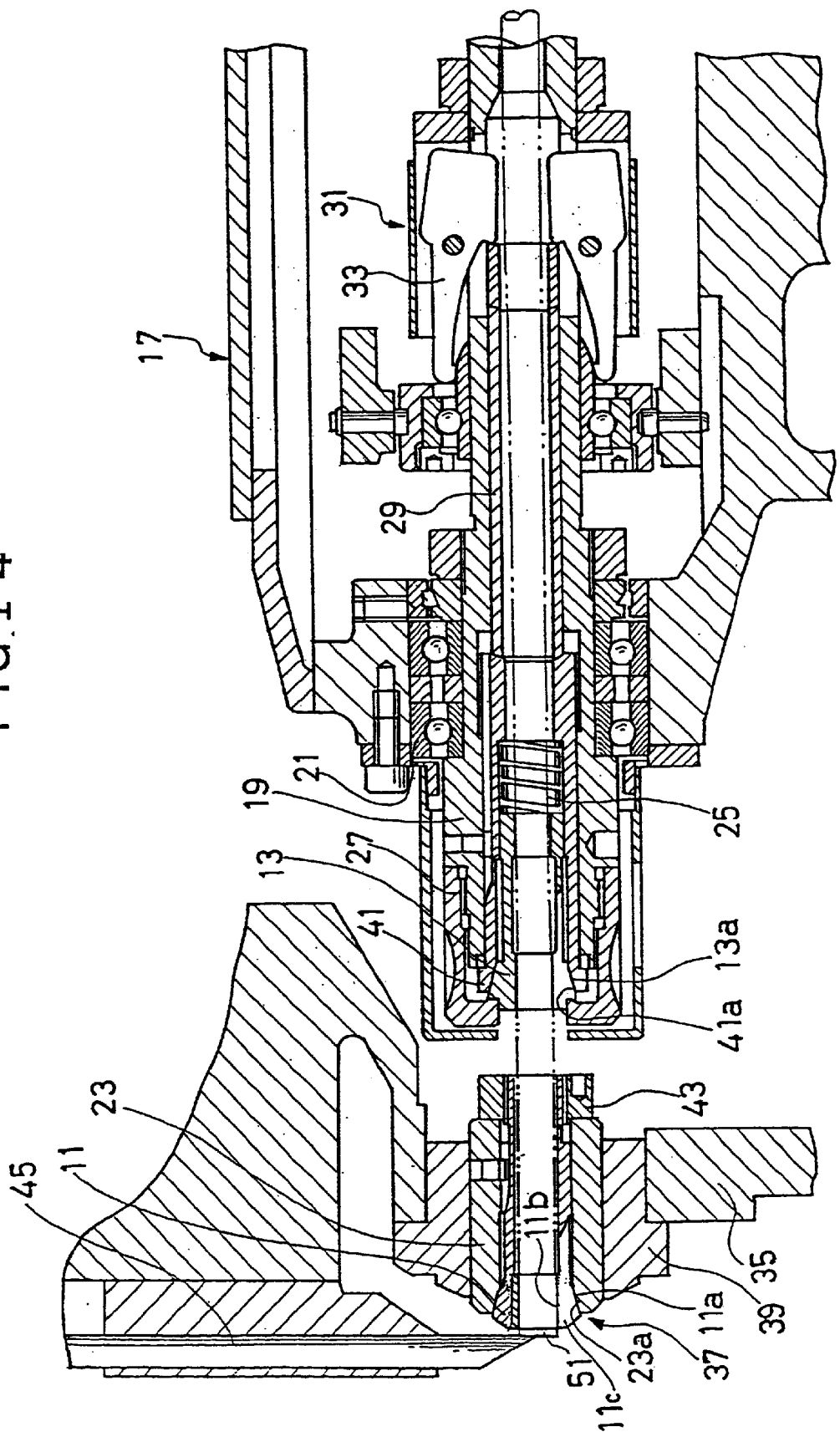
FIG. 14 is a sectional view showing the main parts of an automatic lathe wherein a guide bush unit incorporating the guide bush according to the invention is mounted.

Construction of an Automatic Lathe: FIG. 14

First, construction of a guide bush unit according to the guide bush in the present invention and construction of a numerically controlled automatic lathe employing the guide bush unit is described referring to FIG. 14 which shows neighborhood of a spindle thereof.

FIG. 14 is a sectional view of a stationary guide bush unit which is operated in the way that the guide bush in the present invention is fixed with it as a guide bush unit and a workpiece is rotated on an inner surface of the guide bush.

A spindle stock 17 is mounted on the not shown bed of the numerically controlled automatic lathe for sliding movement in transverse directions, as viewed in FIG. 14. A spindle 19 is supported for rotation in bearings 21 on the spindle stock 17.

And a collet chuck 13 is mounted on the nose of the spindle 19.

The collet chuck 13 is disposed in the center bore of a chucked sleeve 41. A taper outer surface 13a of the collet chuck 13 and a taper inner surface 41a of the chucked sleeve 41 are in surface contact with each other.

Further, a coil spring 25 is inserted at the back end of the collet chuck 13 in an intermediate sleeve 29.

The collet chuck 13 can be pushed out of the intermediate sleeve 29 by the action of the elastic force of the coil spring 25.

The front end of the collet chuck 13 is in contact with a cap nut 27 fastened to the front end of the spindle 19 with screws and the position thereof is determined by that.

The cap nut 27 is provided to restrain the collect chuck 13 from being pushed out of the intermediate sleeve 29 by the force of the coil spring 25.

A chuck operating mechanism 31 is provided on the back end of the intermediate sleeve 29 through the intermediate sleeve 29.

The chuck operating picks 33 are operated to open or close the collet chuck 13 so that the collect chuck 13 can chuck or release the workpiece 51 shown with an imaginary line.

That is to say, when the chuck operating picks 33 of the chuck operating mechanism 31 are turned so that the front ends thereof are moved away from each other, operating portions of the chuck operating picks 33 in contact with the intermediate sleeve 29 move to the left as viewed in FIG. 14 to push the intermediate sleeve 29 to the left.

Consequently, the chucking sleeve 41 in contact with the left end of the intermediate sleeve 29 moves to the left.

The collet chuck 13 is restrained from being pushed out of the spindle 19 by the cap nut 27 fastened to the front end of the spindle 19 with screws.

Therefore, when the chucking sleeve 41 is moved to the left, the taper outer surface 13a of the collet chuck 13 and the taper inner surface 41a of the chucking sleeve 41 are strongly pressed and move along the taper surfaces. Consequently, the inside diameter of the collet chuck 13 is reduced to grip the workpiece 51.

When releasing the workpiece 51 from the collet chuck 13 by expanding the collet chuck 13 by increasing the inside diameter of the collet chuck 13, the chuck operating picks 33 are turned so that the front ends thereof are moved toward each other to remove the force acting to the left on the chucking sleeve 41. Then, the intermediate sleeve 29 and the chucking sleeve 41 are moved to the right as viewed in FIG. 14 by the stored energy of the coil spring 25.

Consequently, the pressure applied to the taper outer surface 13a of the collet chuck 13 and the taper inner surface 41a of the chucking sleeve 41 is removed to allow the collet chuck 13 to expand by its own resilience, so that the inside diameter of the collet chuck 13 increases to release the workpiece 51.

A stationary guide bush unit 37 placed on a spindle center axis of a column 35 is provided in front of the spindle stock 17.

The guide bush unit 37 shown in FIG. 14 is a stationary type fixedly holding the guide bush 11 to support the workpiece 51 rotatably on the inner surface 11b of the guide bush 11, and a bush sleeve 23 is placed in the center bore of a holder 39 fixed to the column 35. A taper inner surface 23a is formed in the front portion of the bush sleeve 23.

The guide bush 11 having a front portion provided with a taper outer surface 11a is placed in the center bore of the bush sleeve 23.

The distance between the inner surface of the guide bush 11 and the outer surface of the workpiece 51 can be adjusted by turning an adjusting nut 43 screwed on the back end portion of the guide bush unit 37.

This is because when the adjusting nut 43 is turned, the inner surface 23a of the bush sleeve 23 and the taper outer surface 11a of the guide bush 11, similarly to the collet chuck 13, is compressed with each other, and the inside diameter of the guide bush 11 is reduced.

A cutting tool 45 is disposed in further front of the guide bush unit 37. The workpiece 51 is chucked by the collet chuck 13 mounted on the spindle 19 and supported by the guide bush unit 37. Further, a portion of the workpiece 51 projecting from the guide bush unit 37 into a machining region is machined for predetermined machining by a combined motion of the cross feed motion of the cutting tool 45 and the longitudinal traverse motion of the spindle stock 17.

Figure 15:
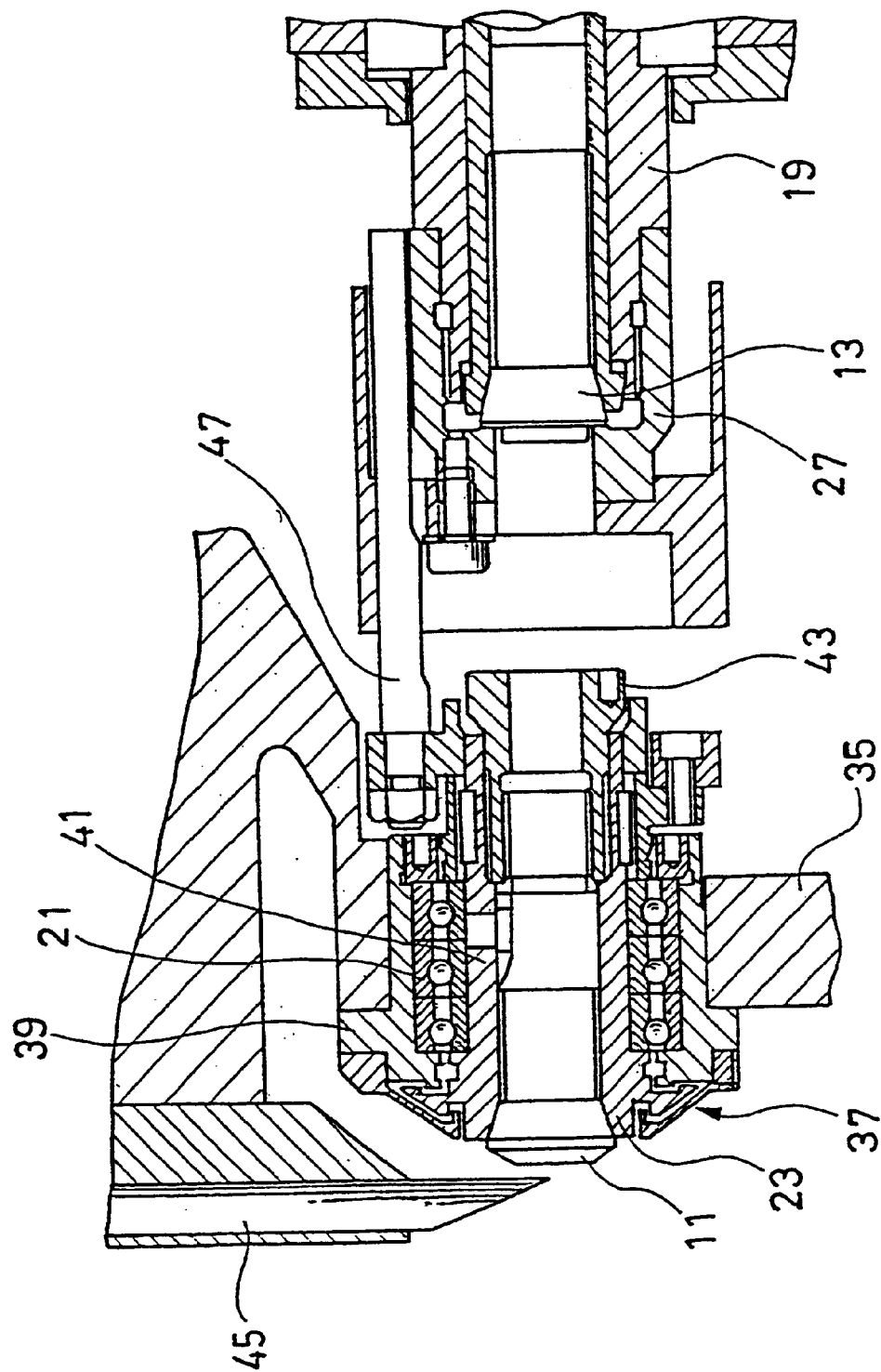
FIG. 15 is a sectional view showing the main parts of another type of automatic lathe wherein a guide bush unit incorporating the guide bush according to the invention is mounted.

Construction of a Rotary Guide Bush Unit: FIG. 15

A rotary guide bush unit that supports rotatably a guide bush gripping a workpiece will be described with reference to FIG. 15.

FIG. 15 is a sectional view of a rotary guide bush unit, and the parts like or corresponding to those shown in FIG. 14 are designated by the same reference characters.

Rotary guide bush units are classified into those holding a guide bush 11 so as to rotate in synchronism with the collet chuck 13 and those holding a guide bush 11 so as to rotate in asynchronism with the collet chuck 13.

A guide bush unit 37 shown in FIG. 15 is a rotary guide bush unit which holds the guide bush 11 so as to rotate in synchronism with the collect chuck 13.

The rotary guide bush unit 37 is driven by a drive rod 47 projecting from the cap nut 27 mounted on the spindle 19.

A gear mechanism or a belt-and-pulley mechanism may be used instead of the drive rod 47 for driving the guide bush unit 37.

The rotary guide bush unit 37 has a bush sleeve 23 in a rotatable manner in a center bore of a holder 39 fixed to a column 35, through bearings 21. And the guide bush 11 is disposed in the center bore of the bush sleeve 23.

The bush sleeve 23 and the guide bush 11 are similar in construction to those illustrated in FIG. 14, respectively.

The distance between the inner surface of the guide bush 11 and the outer surface of the not shown workpiece 51 can be adjusted by turning an adjusting nut 43 screwed on the back end portion of the guide bush unit 37 to decrease the inner diameter of the guide bush 11.

The automatic lathe illustrated in FIG. 15 is the same in construction as the automatic lathe illustrated in FIG. 14 except that this automatic lathe is provided with the rotary guide bush unit 37, and hence the further description thereof will be omitted.

As is clear from above description, a stationary guide bush unit has almost the same structure and operates almost in the same way as a rotate guide bush unit.

Preferred Embodiments of the Guide Bush in Accordance with the Present Invention: FIG. 1 to FIG. 5

Guide bushes in preferred embodiments according to the present invention will be described hereinafter referring to FIG. 1 to FIG. 5.

Figure 2:
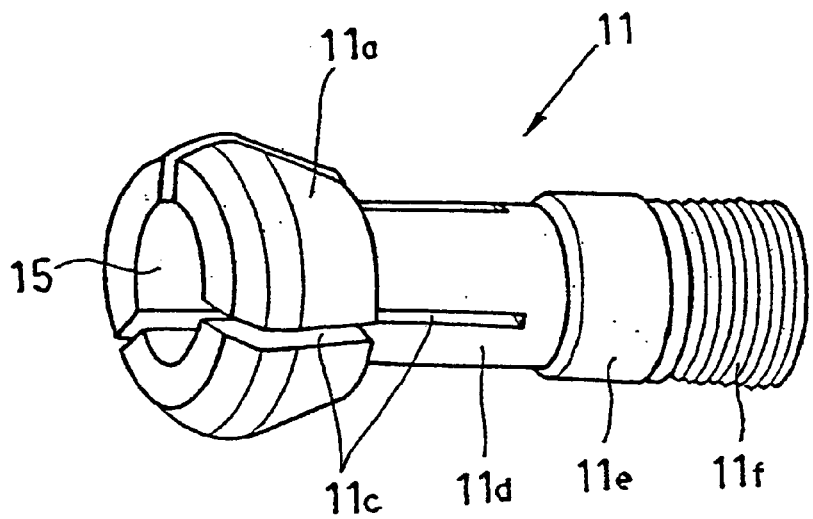
FIG. 2 is a perspective view showing an example of the external appearance of the guide bush according to the invention.
Figure 3:
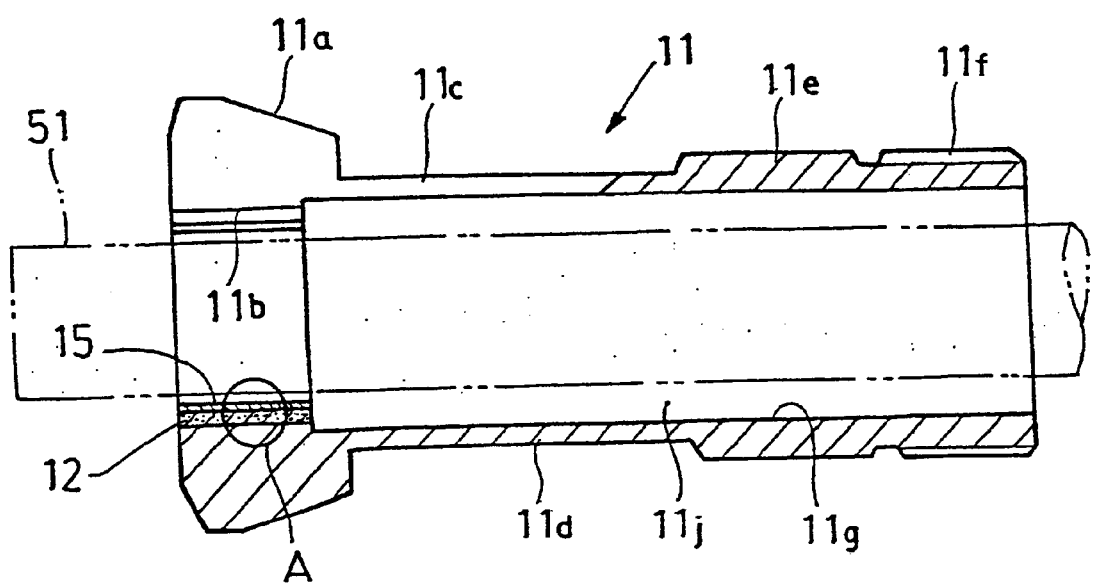
FIG. 3 is a longitudinal sectional view of the guide bush shown in FIG. 2.

FIG. 2 is a diagonal view and FIG. 3 is a sectional view along the direction of the length, respectively, of a guide bush in a preferred embodiment according to the present invention, and a rod-like workpiece 51 is shown with an imaginary line.

Referring to these Figs., a guide bush 11 is shown in a free state in which it is opened. The guide bush 11 is in an approximate cylindrical form having a center bore 11j formed along its center axis, including a taper outer surface 11a formed on one longitudinal end portion and a threaded portion 11f formed on another end portion to be mounted on a column of an automatic lathe.

And an inner surface 11b is formed inside the portion where outer taper surface 11a is formed, to hold a workpiece 51, and the center bore 11j except the inner surface 11b is a stepped center bore 11g with a larger inner diameter than that of the inner surface 11b.

Three slots 11c are formed from the outer taper surface 11a to an elastic bendable portion lid on the guide bush 11 at angular intervals of 120° to make the guide bush flexible.

The distance between the inner surface 11b and the workpiece 51 can be adjusted by pressing the taper outer surface 11a of the guide bush 11 to the taper inner surface of the bush sleeve, so that the elastic bendable portion 11d is bent.

The guide bush 11 has a fitting portion 11e between the elastic bendable portion 11d and the threaded portion 11f. And the fitting portion 11e sets the guide bush 11 with its axis in alignment with the center axis of the spindle.

The guide bush 11 is made of an alloy tool steel (SKS steel). The guide bush 11 is quenched and tempered after an outer form and an inner form thereof are made up.

Further, cemented carbide alloy with 2 mm to 5 mm thickness is attached to the inner surface 11b of the guide bush 11 by brazing to be the cemented carbide alloy 12 shown in FIG. 3. G-2 (JIS) is used as the the cemented carbide alloy 12.

Chemical composition of the G-2 (JIS) is 87–90% of tungsten (W), 5–7% of carbon (C) and 5–7% of cobalt (Co) as a binder.

A distance in the range of 5 to 10 $\mu$m is formed between the inner surface 11b and the workpiece 51 when the guide bush 11 is opened. So it is a problem that the inner surface 11b of the guide bush 11 abrades when the workpiece 51 slides.

Furthermore, the workpiece 51 supported on the guide bush 11 rotates at a high surface speed relative to the inner surface 11b and, when an excessively high pressure is applied to the inner surface 11b by the workpiece 51, seizing may occur.

Accordingly, as shown in FIG. 3, the guide bush 11 according to the invention is provided with a diamond-like carbon (DLC) film 15 formed on the surface (the inner surface) of the cemented carbide alloy 12 fixedly attached to the inner surface of the guide bush 11, for holding the workpiece 51.

Figure 1:
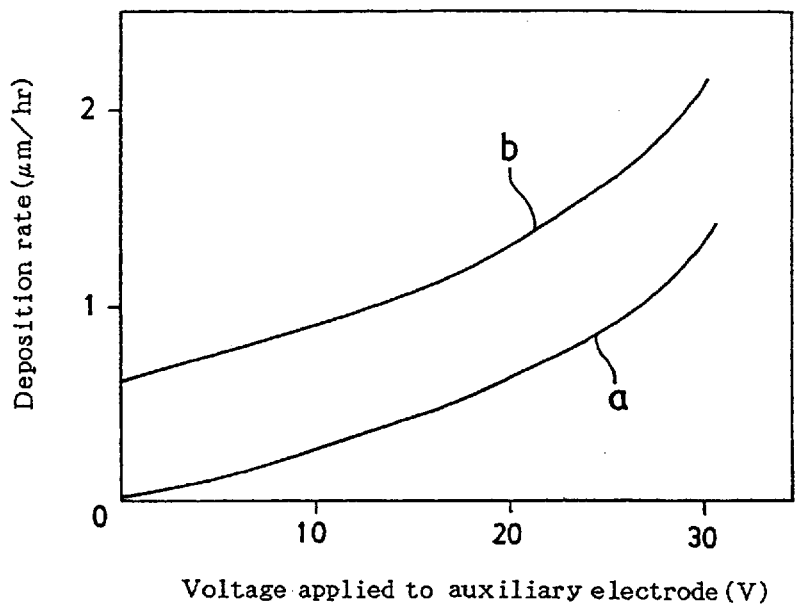
FIG. 1 is an enlarged view showing a film makeup in the vicinity of the inner surface of a guide bush according to a first embodiment of the invention.
Figure 1:
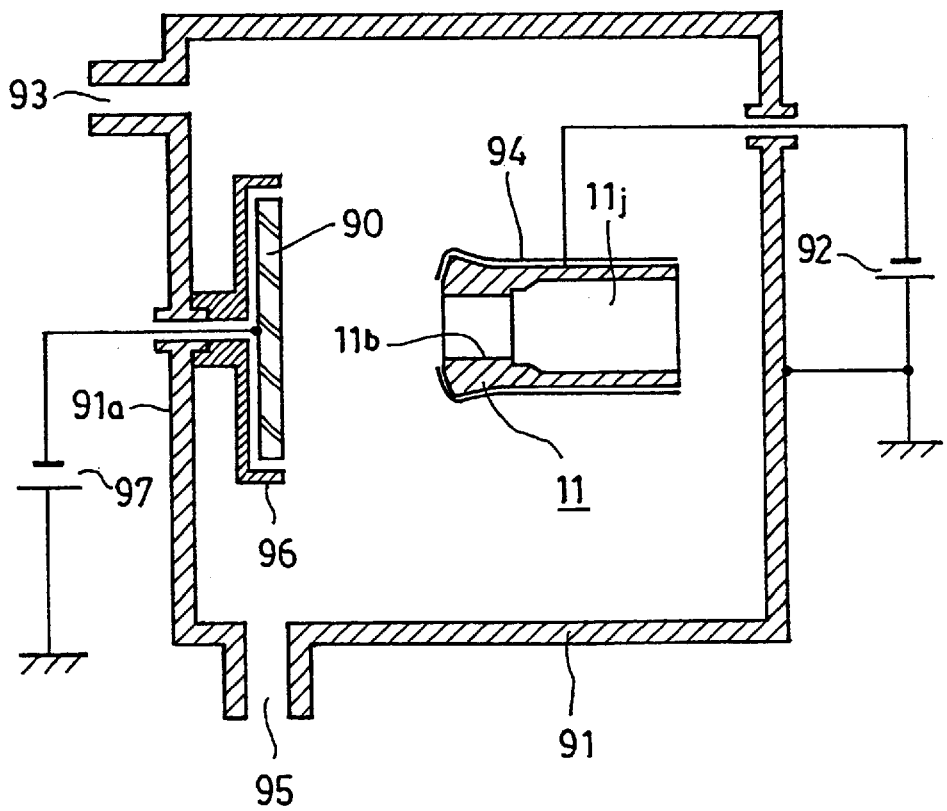

FIG. 1 is an enlarged view of a portion enclosed by the circle A in FIG. 3, showing the structure of the guide bush 11 according to a first embodiment of the invention, in the vicinity of the inner surface 11b.

In actual fact, the cemented carbide alloy 12 is not less than 1000 times thicker than the DLC film 15, however, in FIG. 1 for convinience of illustration, the cemented carbide alloy 12 is illustrated extremely thinner than it actually is.

As shown in FIG. 1, with the first embodiment of the guide bush according to the invention, the cemented carbide alloy 12 is fixedly attached to the inner surface 11b of the guide bush 11 (base member), coming in contact with the workpiece 51 (refer to FIG. 3), and further, the DLC film 15 is formed directly on the surface of the cemented carbide alloy 12.

Cobalt (Co) serving as a binder among constituent materials of the cemented carbide alloy 12 is selectively removed from the surface of the cemented carbide alloy 12, adjoining the DLC film 15. That is, the DLC film 15 is formed on the surface of the cemented carbide alloy 12, from which cobalt (Co) is removed.

The inventors have discovered through tests that in the case of a conventional guide bush, poor adhesiveness of the DLC film against the cemented carbide alloy is attributable to the presence of cobalt serving as a binder when forming the cemented carbide alloy by means of a sintering process.

More specifically, results of the tests have shown that cobalt contained in the cemented carbide alloy was completely dissolved into carbon contained in the DLC film, and this caused deterioration in adhesiveness of the DLC film, resulting in exfoliation thereof.

In view of this fact, with the guide bush 11 according to the invention, cobalt having adverse effects on the adhesiveness of the surface of the cemented carbide alloy 12, adjoining the DLC film 15, is removed.

As a result, with the guide bush 11, there will arise no problem of the DLC film 15 peeling off because the DLC film 15 can be formed over the cemented carbide alloy 12 with excellent adhesion strength. In consequence, it is possible to extend the service life of the guide bush much longer than that of the conventional guide bush, thereby enhancing reliability thereof for use over the long term.

Further, observations were made on the conditions of the surface of the cemented carbide alloy 12, adjoining the DLC film 15, before and after cobalt was removed therefrom, respectively, by use of a scanning electron microscope (SEM).

Results showed that marks caused by a grinding process applied to the inner surface of the cemented carbide alloy 12 were observed on the surface of the cemented carbide alloy 12 before cobalt was removed therefrom.

On the other hand, no mark caused by the grinding process applied was observed on the surface of the cemented carbide alloy 12 after cobalt was removed therefrom.

Observations with the naked eye on the surface of the cemented carbide alloy 12 also indicated an obvious difference in the surface condition.

That is, while the surface of the cemented carbide alloy 12 before cobalt was removed was found to be a polished surface and in a specular condition, the surface of the cemented carbide alloy 12 after cobalt was removed was found not to be in a specular condition but was in a rough condition.

This is due to a fact that when cobalt serving as a binder is removed from the surface of the cemented carbide alloy 12, adjoining the DLC film 15, tungsten and carbon which are bonded with the binder through sintering treatment also peel off, turning the surface thereof to a rough finish without leaving any mark caused by the grinding process as described in the foregoing.

Thus, the adhesiveness of the DLC film 15 is further improved due to the fact that the marks caused by the grinding process on the surface of the cemented carbide alloy 12, adjoining the DLC film 15, have disappeared not to be observed, and the surface thereof has turned to a rough finish.

Particularly, with respect to the marks caused by the grinding process, it is considered that if the DLC film 15 is formed on spots where the marks are present, membrane stress due to elongation or contraction is developed at the spots, thereby causing poor adhesiveness of the DLC film 15. Therefore, the elimination of the marks can prevent a phenomenon of the membrane stress causing deterioration in the adhesiveness from occurring.

Consequently, with the guide bush 11 according to the invention, a phenomenon of the DLC film 15 peeling off does not occur, and it is possible to extend the service life of the guide bush much longer than that of the conventional guide bush, thereby enhancing reliability thereof for use over the long term.

The DLC film 15 is a hard carbon film in a blackish color, and has properties very similar to those of diamond as described in the foregoing. That is, the DLC film 15 has high mechanical hardness, low friction coefficient, good electric insulation, high thermal conductivity, and excellent corrosion resistance.

Accordingly, with the guide bush 11 according to the invention, it is possible to inhibit wear and tear on the inner surface thereof, coming in contact with a workpiece, even in the case of a heavy cutting operation for executing deep cut at a high cutting speed, preventing surface flaws from occurring to the workpiece, and also to inhibit seizure from occurring between the guide bush 11 and the workpiece.

Further, the guide bush 11 is provided with the DLC film 15 on the inner surface lib thereof with the cemented carbide alloy 12 having high hardness and interposed therebetween.

If the cemented carbide alloy 12 having high hardness is provided underneath the DLC film 15 as described above, this makes it possible to inhibit localized exfoliation and wear and tear of the DLC film 15, thereby enhancing reliability of the guide bush 11 for use over the long term.

An appropriate thickness of the DLC film 15 provided on the inner surface 11b of the guide bush 11 ranges from 1 to 5 $\mu$m.

Now, second and third embodiments of a guide bush according to the invention are described hereinafter with reference to FIGS. 4 and 5, respectively.

Figure 4:
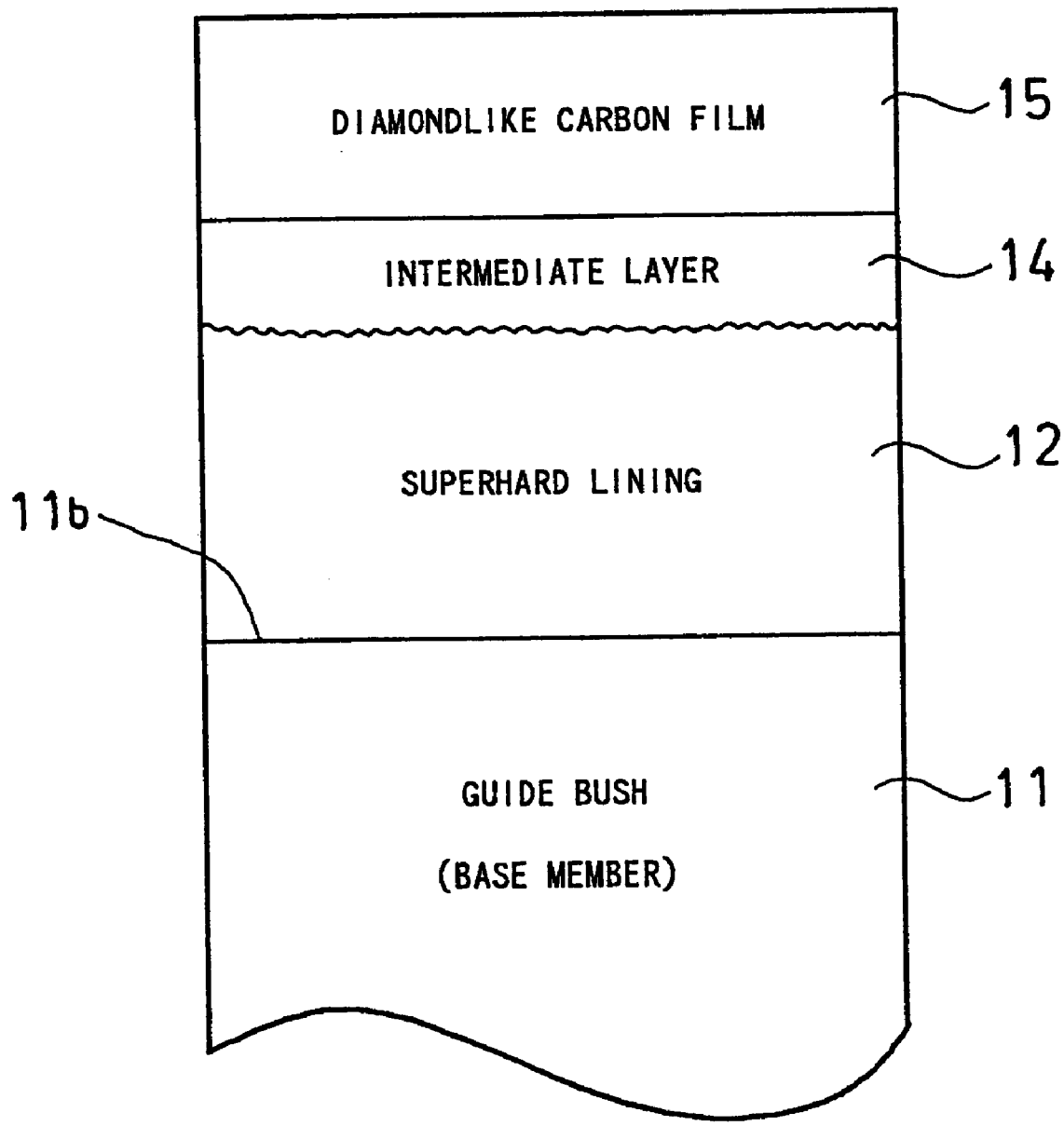
FIG. 4 is an enlarged view showing a film makeup in the vicinity of the inner surface of a guide bush according to a second embodiment of the invention.
Figure 5:
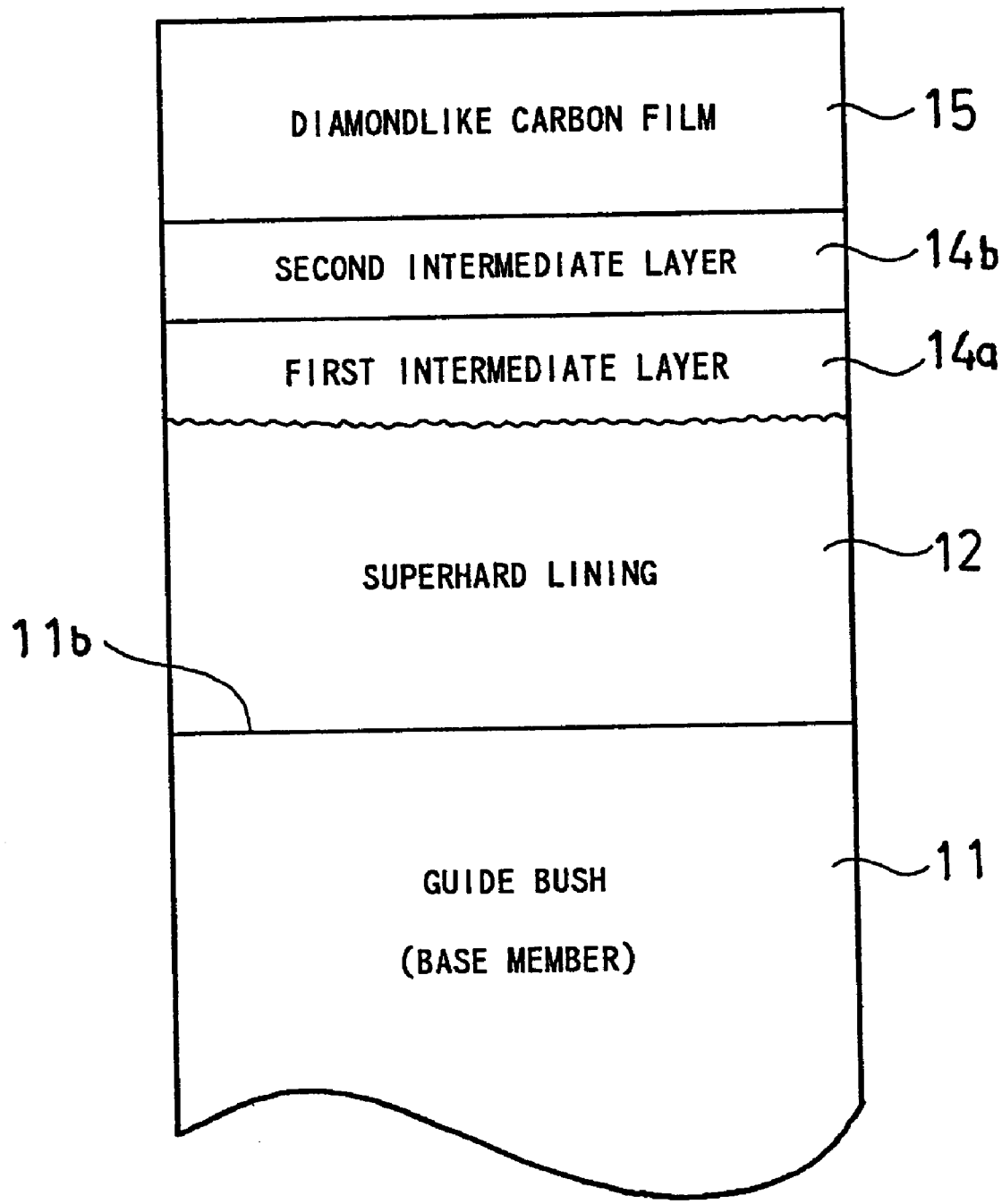
FIG. 5 is an enlarged view showing a film makeup in the vicinity of the inner surface of a guide bush according to a third embodiment of the invention.

FIGS. 4 and 5 are similar to FIG. 1, showing the second and third embodiments of the guide bush according to the invention, respectively. That is, FIGS. 4 and 5 are enlarged views of the portion enclosed by the circle A in FIG. 3, showing the structure of the guide bush 11, in the vicinity of the inner surface 11b thereof. In these figures as well, a cemented carbide alloy 12 is in fact by far thicker than a DLC film 15, however, the cemented carbide alloy 12 is illustrated to be much thinner than it actually is for convenience of illustration.

Alloy tool steel (SKS) is also used for the base member of the guide bush 11, and after forming an outer shape as well as an inner shape thereof, quenching and tempering treatments are applied thereto. Further, the cemented carbide alloy 12 is formed by fixedly attaching a cemented carbide alloy having a thickness in the range of 2 to 5 mm to the inner surface 11b of the guide bush 11 by means of brazing.

The cemented carbide alloy used is composed of 83–89% of tungsten (W), 5–8% of cobalt (Co) as a binder, and the balance of carbon (C).

With the second embodiment of the invention shown in FIG. 4, the cemented carbide alloy 12 is fixedly attached to the inner surface 11b of the guide bush 11, an intermediate layer 14 is provided on the cemented carbide alloy 12, and the DLC film 15 is formed on the intermediate layer 14.

And cobalt (Co) serving as a binder of the cemented carbide alloy 12 is selectively removed from the surface of the cemented carbide alloy 12, adjoining the intermediate layer 14. That is, the DLC film 15 is formed on the surface of the cemented carbide alloy 12, where cobalt (Co) contained therein has been removed, with the intermediate layer 14 interposed therebetween.

As a result, the DLC film 15 of the guide bush 11 can be formed with excellent adhesiveness on the inner surface 11b of the base member for the guide bush 11, thus preventing a problem of exfoliation from arising.

Consequently, it has become possible to extend the service life of the guide bush much longer than that of the conventional guide bush, so that reliability thereof for use over the long term can be enhanced.

Excellent features of the guide bush 11 according to this embodiment as described in the foregoing are attributable to the following reasons.

Observations were made on the condition of the surface of the cemented carbide alloy 12, adjoining the intermediate layer 14, before and after cobalt was removed therefrom, respectively, by use of a scanning electron microscope (SEM).

Results showed that marks caused by a grinding process applied to the inner surface of the cemented carbide alloy 12 were observed on the surface of the cemented carbide alloy 12 before cobalt was removed therefrom. On the other hand, no mark caused by the grinding process applied was observed on the surface of the cemented carbide alloy 12 after cobalt was removed therefrom.

Observations with naked eyes on the surface of the cemented carbide alloy 12 also indicated an obvious difference in the surface condition between before and after cobalt was removed.

That is, while the surface of the cemented carbide alloy 12 before cobalt was removed was found to be a polished surface and in a specular condition, the surface of the cemented carbide alloy 12 after cobalt was removed was found not to be in a specular condition but was in a rough condition.

This is due to a fact that when cobalt is removed from the surface of the cemented carbide alloy 12, adjoining the intermediate layer 14, tungsten and carbon which are bonded with a binder through sintering treatment also peel off since the cobalt is serving as the binder, turning the surface of the cemented carbide alloy 12 to rough finish without leaving any mark caused by the grinding process as described in the foregoing.

Thus, the adhesiveness of the intermediate layer 14 is improved due to a fact that the marks caused by the grinding process on the surface of the cemented carbide alloy 12, adjoining the intermediate layer 14, have disappeared not to be observed, and the surface thereof has turned to rough finish.

Particularly, with respect to the marks caused by the grinding process, it is considered that if the intermediate layer 14 is formed on spots where the marks are present, membrane stress due to elongation or contraction is considered to be developed at the spots, causing poor adhesiveness of the intermediate layer 14. Therefore, the elimination of the marks can prevent a phenomenon of the membrane stress causing deterioration in the adhesiveness from occurring.

As a result, with the guide bush 11 according to this embodiment of the invention, the phenomenon of the intermediate layer 14 peeling off does not occur. Consequently, the adhesiveness of the DLC film 15 formed on top of the intermediate layer 14 is also improved, so that it becomes possible to extend the service life of the guide bush 11 much longer than that of the conventional guide bush, thereby enhancing reliability of the guide bush 11 for use over the long term.

When the intermediate layer 14 is made up of a single layer film as with the case of the second embodiment, it is preferable that same is made up of a film made of an alloy containing carbon such as a silicon carbide (SiC) film or tungsten carbide (WC) film.

Thus by interposing the intermediate layer 14 between the cemented carbide alloy 12 and the DLC film 15, the adhesiveness of the DLC film 15 is enhanced.

Close observation made on spots of the conventional guide bush where the intermediate layer or the DLC film was exfoliated indicated that exfoliation occurred at spots where the intermediate layer or the DLC film could not attain good adhesion with cobalt as a binder contained in the cemented carbide alloy. The causes of such a phenomenon are not well known, however, it is presumed as one of the conceivable causes that cobalt underwent oxidation and an oxide film thereof having poor adhesiveness was formed, thereby causing the DLC film or the intermediate layer to peel off from the inner surface of the guide bush.

With the guide bush 11 according to the invention, therefore, cobalt as a binder contained in the cemented carbide alloy 12 is removed from the inner surface of the cemented carbide alloy 12, on which the intermediate layer 14 is formed. Thus, the removal of cobalt causing poor adhesion of the intermediate layer 14 from the inner surface of the cemented carbide alloy 12 enables the intermediate layer 14 and the DLC film 15 to be formed on the inner surface 11b of the guide bush 11 with a high adhesion strength maintained, and consequently, exfoliation of the DLC film 15 from the inner surface 11b of the guide bush 11 does not occur.

The DLC film 15 is formed on the inner surface 11b of the guide bush 11 to a thickness in the order ranging from 1 to 10 $\mu$m, and the intermediate layer 14 to a thickness in the order of 0.5 $\mu$m.

Next, as shown in FIG. 5, with the third embodiment of the invention, a cemented carbide alloy 12 is fixedly attached to the inner surface 11b of a guide bush 11, a first intermediate layer 14a and a second intermediate layer 14b, one over the other, are formed on the cemented carbide alloy 12, and further, a DLC film 15 is formed on the second intermediate layer 14b. The DLC film 15 is formed to a thickness in the range of 1 to 10 $\mu$m.

As is the case with the second embodiment, cobalt serving as a binder of the cemented carbide alloy 12 is selectively removed from the surface of the cemented carbide alloy 12, adjoining the first intermediate layer 14a.

The first intermediate layer 14a is made up of a titanium (Ti) film or a chromium (Cr) film, and the second intermediate layer 14b is made up of a silicon (Si) film or a germanium (Ge) film. The first and second intermediate layers 14a, 14b are formed to a thickness in the order of 0.5 μm, respectively.

Since the first and second intermediate layers 14a, 14b are formed by the sputtering method, these are made up of a film with gradient thickness, respectively, such that the film is thicker at the open end of the guide bush 11, and becomes thinner inwardly away from the open end thereof.

The guide bush 11 provided with the first intermediate layer 14a and the second intermediate layer 14b which are interposed between the cemented carbide alloy 12 and the DLC film 15 has the following features.

That is, as the first intermediate layer 14a made of titanium or chromium has an excellent adhesive strength with the cemented carbide alloy 12, adhesiveness therebetween is reinforced, and further, the presence of the first intermediate layer 14a is able to inhibit cobalt as a binder contained in the cemented carbide alloy 12 from reacting with carbon of the DLC film 15.

Furthermore, as the second intermediate layer 14b made of silicon or germanium, both being elements belonging to the IV group on the periodic table, has excellent adhesiveness with the DLC film 15 made of carbon belonging to the same IV group on the periodic table, strong adhesion is achieved through covalent bond therebetween.

As a result, the DLC film 15 can be formed with excellent adhesiveness on the inner surface 11b of the guide bush 11.

Meanwhile, for the second intermediate layer 14b, a film made of an alloy containing carbon such as a silicon carbide (SiC) film or a tungsten carbide (WC) film may be used instead of a silicon (Si) film or a germanium (Ge) film.

Since the silicon carbide (SiC) film or the tungsten carbide (WC) film has substantially the same function as that of the silicon (Si) film or the germanium (Ge) film, the silicon carbide (SiC) film or the tungsten carbide (WC) film, when used for the second intermediate layer 14b, has substantially the same advantageous effect as that of the silicon (Si) film or the germanium (Ge) film.

Preferred Embodiments of a Method of Forming a DLC Film According to the Invention: FIGS. 1 to 5 and FIGS. 6 to 13

Next, preferred embodiments of a method of forming a diamond-like carbon (DLC) film in a guide bush according to the invention are described hereinafter.

First, a method of forming a DLC film in a guide bush for fabricating a film structure of the guide bush according to the first embodiment of the invention as described with reference to FIGS. 1 through 3 is described hereinafter.

The method of forming the DLC film is the method of forming the DLC film 15 on the inner surface 11b of the guide bush 11, for holding the workpiece 51 as shown in FIG. 3, provided with the cemented carbide alloy 12 containing at least cobalt, comprises the following steps:

(1) a step of removing cobalt contained in the surface of the cemented carbide alloy 12 by etching;

(2) a step of placing the guide bush 11 in a vacuum vessel with an electrode inserted inside a center bore 11j thereof; and (3) a step of evacuating the vacuum vessel before introducing a gas containing carbon, and causing a plasma to be generated inside the center bore 11j by applying a DC voltage or RF electric power to the guide bush 11 while applying a positive DC voltage to the electrode, thereby forming the DLC film 15 on the surface of the cemented carbide alloy 12 formed on the inner surface 11b of the guide bush 11.

Hereupon, the step (1) of removing cobalt contained in the surface of the cemented carbide alloy 12 by etching is first described.

The removal of cobalt is preferably performed by means of a wet etching process.

As an etchant for wet etching to selectively remove cobalt, a blended solution of sodium hydroxide (NaOH) and aqueous hydrogen peroxide ($H_2O_2$) is used.

By use of the blended solution, other constituent materials of the cemented carbide alloy 12 such as tungsten and carbon, and the constituent material of the guide bush 11, namely, alloy tool steel (SKS), are not etched at all, but only cobalt can be selectively etched.

The wet etching process for the removal of cobalt is executed by immersing the guide bush 11 in the blended solution of sodium hydroxide (NaOH) and aqueous hydrogen peroxide ($H_2O_2$) as the etchant at room temperature for a duration of from 3 to 5 hours.

Now, the step (2) of placing the guide bush 11 in the vacuum vessel and the step (3) of forming the DLC film 15 on the surface of the cemented carbide alloy 12 are described hereinafter.

There are available three types of apparatuses in which these step are performed. Further, each of them is available in two ways in which the electrode inserted in the center bore of the guide bush is grounded or a positive DC voltage is applied thereto.

Figure 6:
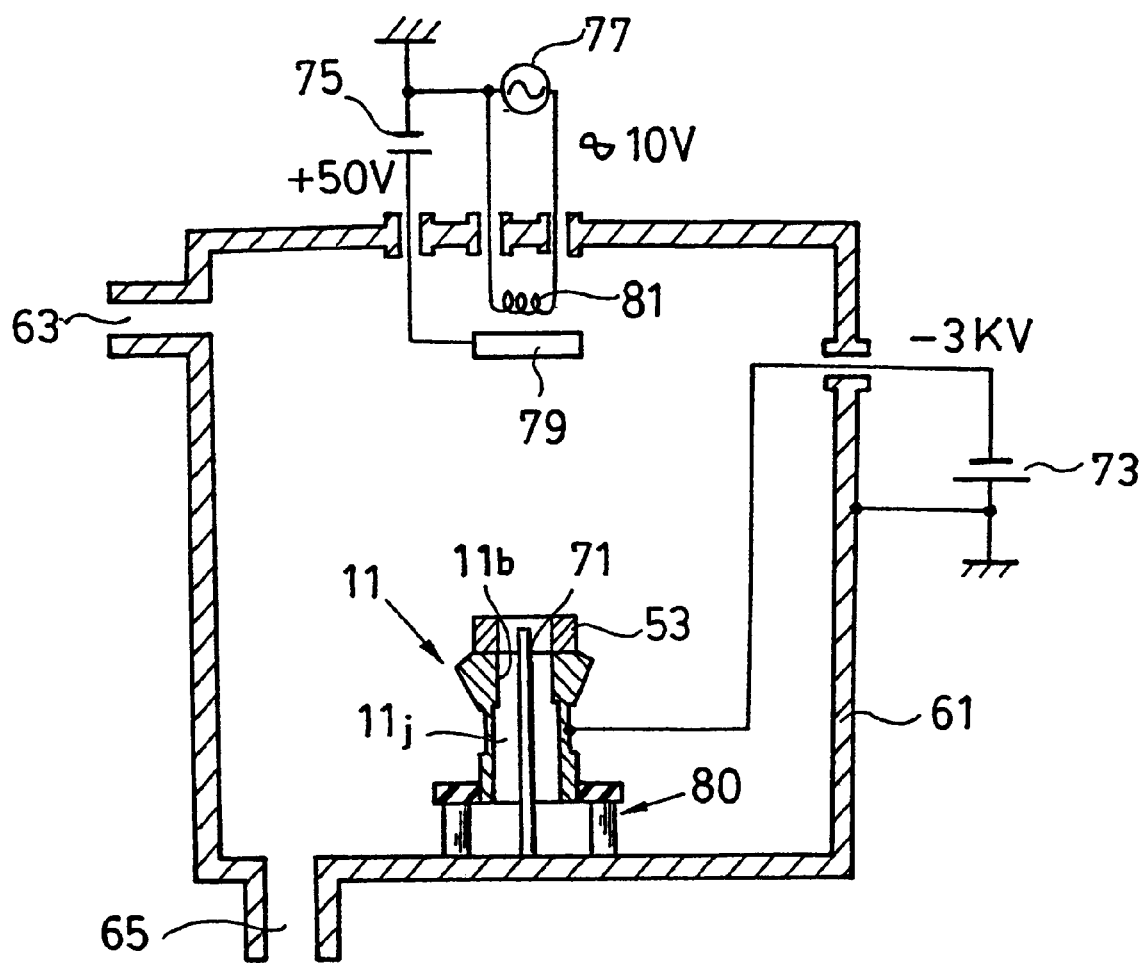
FIG. 6 is a schematic sectional view for illustrating an embodiment of a method of forming a DLC film in a guide bush according to the invention, showing an example of steps thereof.

FIG. 6 is a schematic sectional view showing an example of the apparatuses. In this example, use is made of a vacuum vessel 61 having a gas inlet port 63, a gas outlet port 65, an anode 79 and a filament 81 was put to use.

The guide bush 11 wherein cobalt contained in the surface of the cemented carbide alloy 12 has been removed and an electrode 71 in a rod-like shape is inserted in the center bore 11j thereof, is placed in the vacuum vessel 61 on insulating support 80. In this case, an open and face of the inner surface 11b of the guide bush 11 is disposed opposite to the anode 79, and a dummy member 53 is disposed on the open end face.

The dummy member 53 is formed in a ring-like shape, and has an opening in the center thereof, the diameter of which is substantially the same as that of an opening formed by the inner surface 11b of the guide bush 11.

The outside diameter of the dummy member 53 is set to be the same size as that of the open end face of the guide bush 11.

The electrode 71 inserted in the center bore 11j of the guide bush 11 is grounded through connection with the vacuum vessel 61 which is grounded. The electrode 71 is disposed so as to be positioned along the center axis of the center bore 11j of the guide bush 11 and such that the tip thereof is slightly set back from a level of the upper end of the dummy member 53.

Subsequently, the vacuum vessel 61 is evacuated to not higher than $3 \times 10^{-5}$ torr through the gas outlet port 65 by evacuating means (not shown). Thereafter, benzene ($C_6H_6$) as a gas containing carbon is introduced into the vacuum vessel 61 through the gas inlet port 63, controlling pressure inside the vacuum vessel 61 to be at $5 \times 10^{-3}$ torr.

Thereafter, a DC voltage at −3 kV is applied to the guide bush 11 from a DC power source 73, a DC voltage at +50V is applied to the anode 79 from an anode power source 75, and an AC voltage at 10V is applied to the filament 81 from a filament power source 77 to allow flow of electric current at 30 A.

Whereupon, a plasma is generated in a region surrounding the guide bush 11 and inside the center bore 11j, thereby forming the DLC film 15 (refer to FIG. 3) on the surface of the cemented carbide alloy 12 fixedly attached to the inner surface 11b of the guide bush 11.

With the aforementioned method of forming the DLC film, it is possible to cause the plasma to occur not only in the peripheral region of the guide bush 11 but also inside the center bore 11j of the guide bush 11, because the electrode 71 in a rod-like shape, grounded and inserted in the center bore 11j, is provided.

By providing the electrode 71 at ground potential inside the center bore 11j of the guide bush 11, side portions of the guide bush 11, at the same potential, are prevented from facing each other in a region inside the center bore 11j. Consequently, abnormal discharge called hollow discharge will not occur, thereby improving adhesiveness of the DLC film to be formed on the inner surface 11b of the guide bush 11. Further, since potential characteristic in the longitudinal direction inside the center bore 11j of the guide bush 11 becomes uniform, the DLC film to be formed on the inner surface 11b will have even thickness.

It is sufficient that the diameter of the electrode 71 is smaller than that of the center bore 11j of the guide bush 11, however, a plasma forming region is preferably provided in a gap in the order of 4 mm formed between the inner surface 11b and the electrode 71. And the electrode 71 is formed of a metal such as stainless steel.

Further, the electrode 71 is circular in cross section, and may have a length such that when the electrode 71 is inserted in the guide bush 11, the top end thereof is flush with the open end face of the dummy member 53 or projects above the open end face of the dummy member 53. However, in the example shown in the figure, the electrode 71 has a length such that the tip thereof is disposed at a level set back by 1 to 2 mm below the top end face of the dummy member 53.

The dummy member 53 disposed on the open end face of the guide bush 11 fulfills the following function.

With the method of forming the DLC film 15 shown in FIG. 6, the plasma is generated inside the center bore 11j of the guide bush 11 and in the peripheral region thereof.

And electric charge tends to converge on the open end face of the guide bush 11, which is then caused to be in a state of higher electric charge in comparison with the interior of the center bore 11j, and the so-called edge effect occurs.

Accordingly, the plasma generated in the vicinity of the open end face of the guide bush 11 has higher intensity than that generated in other regions and is yet unstable. Further, the open end face region of the guide bush 11 is under influence of both the plasma generated inside the center bore 11j of the guide bush 11 and the plasma generated in the peripheral region of the guide bush 11.

If the DLC film is formed under such conditions, the adhesiveness of the DLC film formed in a region several mm inward away from the open end face of the guide bush 11 differs from that in other regions, and the same can be said of the quality thereof to some extent.

Accordingly, if the formation of the DLC film is carried out with the dummy member 53 disposed on the open end face of the guide bush 11, a region where the DLC film has different quality and adhesiveness does not occur on the inner surface of the guide bush 11, but occurs on the inner surface of the opening of the dummy member 53.

Results of a test conducted on the formation of the DLC film employing the apparatus shown in FIG. 6, but without employing the dummy member 53, showed that a region 1 to 2 mm in vertical length, where the quality and adhesiveness of the DLC film differs from those in other regions, occurred about 4 mm inward away from the open end face of the guide bush 11.

Accordingly, a film was formed under the same conditions as those described above under which the DLC film was formed by disposing the dummy member 53, with vertical length of 10 mm and with the top end face thereof substantially in the same size as that of the guide bush 11, on the open end face of the guide bush 11. As a result, the region where the DLC film has different quality and adhesiveness was found on the inner surface of the opening of the dummy member 53, but was not found at all on the inner surface 11b of the guide bush 11.

Next, other examples of a method of forming the DLC film in the guide bush are described hereinafter with reference to FIGS. 7 and 8. In these figures, parts corresponding to those in FIG. 6 are denoted by the same reference numerals.

Similarly to the case previously described, cobalt serving as a binder is first removed from a surface region of the cemented carbide alloy 12 formed on the inner surface 11b of the guide bush 11 by means of the wet etching process.

Figure 7:
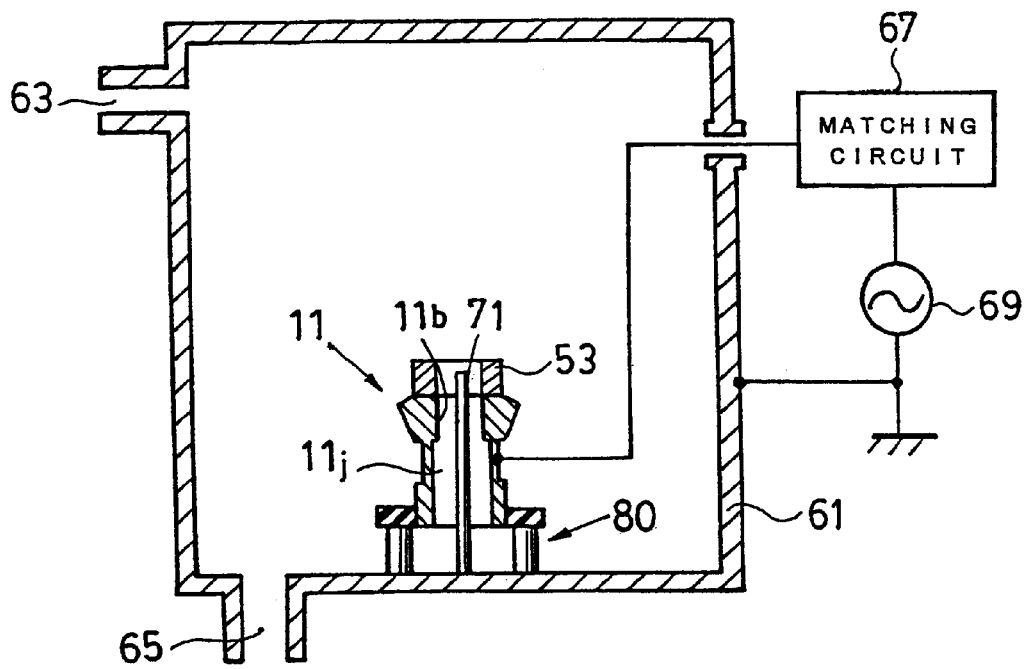
FIG. 7 is a schematic sectional view similar to FIG. 6, showing another example of the steps thereof.

With the example shown in FIG. 7, a guide bush 11 wherein cobalt contained in the surface of the cemented carbide alloy formed on the inner surface 11b thereof has been removed is placed in a vacuum vessel 61 having a gas inlet port 63 and a gas outlet port 65.

As is with the case previously described, an electrode 71 in a rod-like shape which is grounded is inserted in the center bore 11j of the guide bush 11, and a dummy member 53 in a ring-like form is disposed on the open end face of the guide bush 11.

Subsequently, the vacuum vessel 61 is evacuated to not higher than $3\times10^{-5}$ torr through the gas outlet port 65 by evacuating means (not shown). Thereafter, methane gas ($CH_4$) as a gas containing carbon is introduced into the vacuum vessel 61 through the gas inlet port 63, adjusting degree of vacuum therein to be at 0.1 torr.

And RF electric power at a frequency of 13.56 MHz is applied to the guide bush 11 from an RF power source 69 via a matching circuit 67.

Thereupon, a plasma is generated in not only the peripheral region but also the center bore 11j, thereby forming the DLC film on the surface of the cemented carbide alloy formed on the inner surface 11b of the guide bush 11.

Since operational effect in this case is the same as that in the case of the example shown in FIG. 6, description thereof is omitted.

Figure 8:
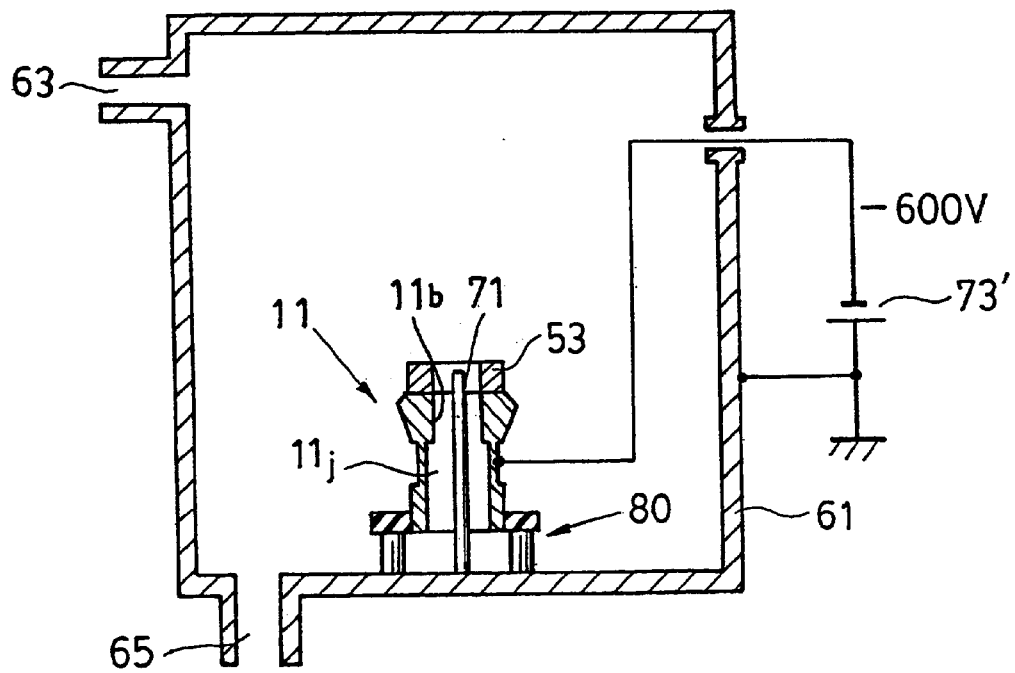
FIG. 8 is a schematic sectional view similar to FIG. 6, showing still another example of the steps thereof.

Similarly to the case of the example previously described, with the example shown in FIG. 8 as well, a guide bush 11 wherein cobalt contained in the surface of the cemented carbide alloy formed on the inner surface 11b thereof has been removed is placed in a vacuum vessel 61 having a gas inlet port 63 and a gas outlet port 65.

Hereupon, an electrode 71 in a rod-like shape which is grounded is inserted in the center bore 11j of the guide bush 11, and a dummy member 53 in a ring-like shape is disposed on the open end face of the guide bush 11.

Subsequently, the vacuum vessel 61 is evacuated to not higher than $3\times10^{-5}$ torr through the gas outlet port 65 by evacuating means (not shown). Thereafter, methane gas ($CH_4$) as a gas containing carbon is introduced into the vacuum vessel 61 through the gas inlet port 63, adjusting degree of vacuum therein to be at 0.1 torr.

Thereafter, a negative DC voltage at −600V is applied to the guide bush 11 from a DC power source 73'.

Thereupon, a plasma is generated both in the peripheral region of the guide bush 11 and inside the center bore 11j, thereby forming the DLC film on the surface of the cemented carbide alloy formed on the inner surface 11b of the guide bush 11. Since operational effect in this case is the same as that in the case of the example shown in FIG. 6, description thereof is omitted.

Next, still other examples of a method of forming the DLC film in the guide bush are described hereinafter with reference to FIGS. 9, 10 and 11.

The examples shown in FIGS. 9, 10 and 11 correspond to those previously described with reference to FIGS. 6, 7 and 8, respectively, and differ from the latter only in that an electrode 71 in a rod-like shape which is inserted in the center bore 11j of the guide bush 11 is insulated and supported by an insulating support member 85 such as an insulator or so forth, fitted into the center bore 11, and a positive DC voltage at +20V is applied to the electrode 71 from a DC power source 83.

In the case of these examples as well, a plasma can be generated in the peripheral region of the guide bush 11, including the interior of the center bore 11j thereof, thereby forming the DLC film having a high adhesion strength on the surface of the cemented carbide alloy formed on the inner surface 11b of the guide bush 11.

FIG. 12 is a graph showing a correlation between positive DC voltage applied to the electrode 71 in this case, and thickness of the hard carbon film formed on the inner surface 11b of the guide bush In the graph shown in FIG. 12, variation in the thickness of the hard carbon film according as the positive DC voltage applied to the electrode 71 is varied from 0V to 30V is indicated when a gap dimension between the inner surface 11b of the guide bush 11 and the electrode 71 is 3 mm and 5 mm, respectively.

In the figure, a curve denoted by "a" indicates a characteristic of variation in the thickness when the gap dimension between the inner surface 11b of the guide bush 11 and the electrode 71 is 3 mm, and a curve denoted by "b" indicates the characteristic when the gap dimension is 5 mm.

As shown by the curves a and b in FIG. 12, a rate at which the DLC film is formed becomes higher according as the positive DC voltage applied to the electrode 71 from the DC power source 83 is increased.

It is further indicated that the rate at which the DLC film is formed becomes higher according as the gap dimension between the inner surface 11b of the guide bush 11 and the electrode 71 is increased.

When the gap dimension described above is 3 mm as indicated by the curve a, a plasma is not generated inside the center bore 11j of the guide bush 11 if the voltage applied to the electrode 71 is 0V, that is, the electrode 71 is at ground potential, so that the DLC film is not formed.

Even when the gap dimension is 3 mm, however, a plasma is generated around the electrode 71 inside the center bore 11j by raising the positive DC voltage applied to the electrode 71, so that the hard carbon film can be formed.

Figure 9:
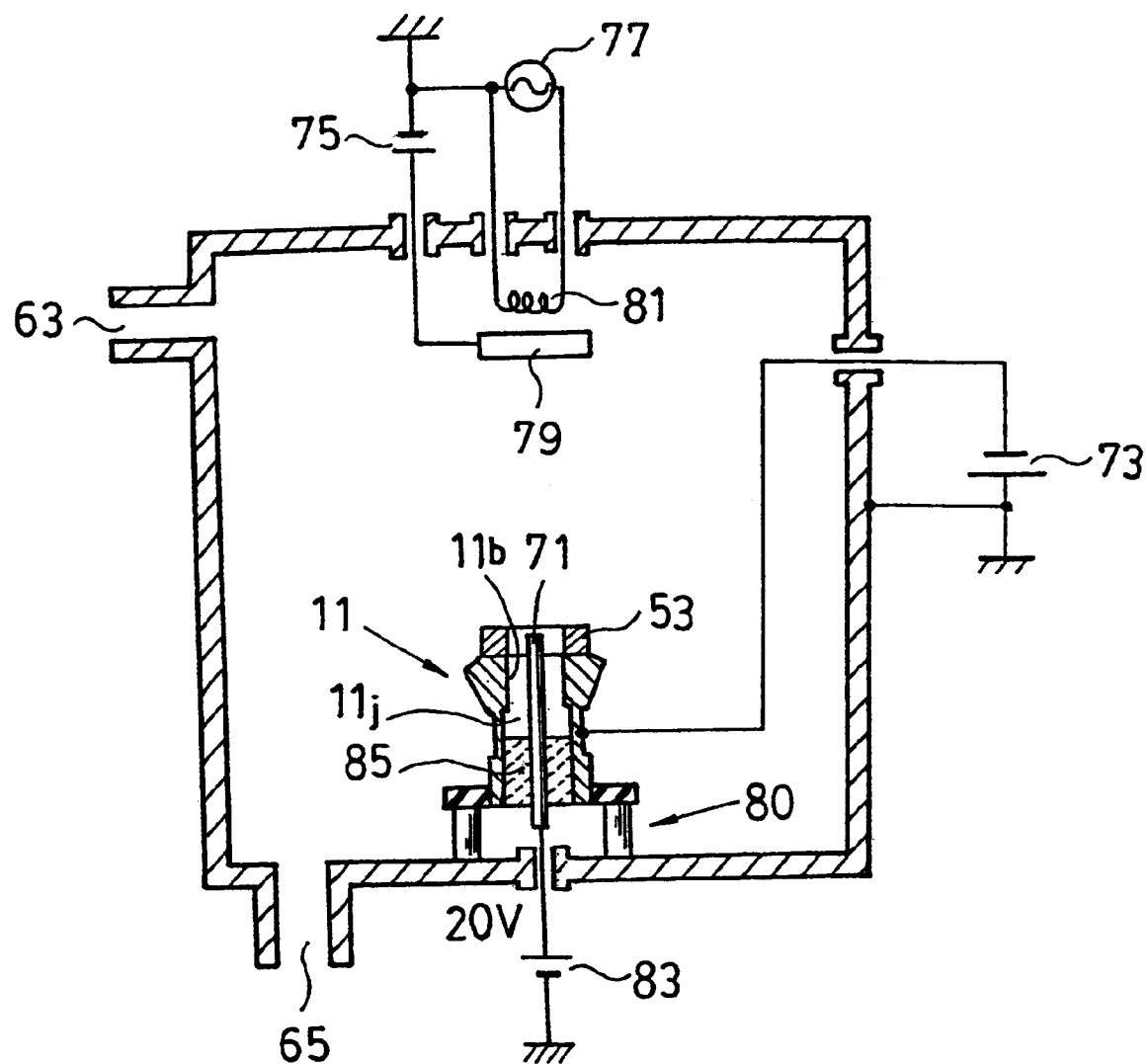
FIG. 9 is a schematic sectional view for illustrating the embodiment of the method of forming the DLC film in the guide bush according to the invention, showing a partially modified example of the step in FIG. 6.
Figure 10:
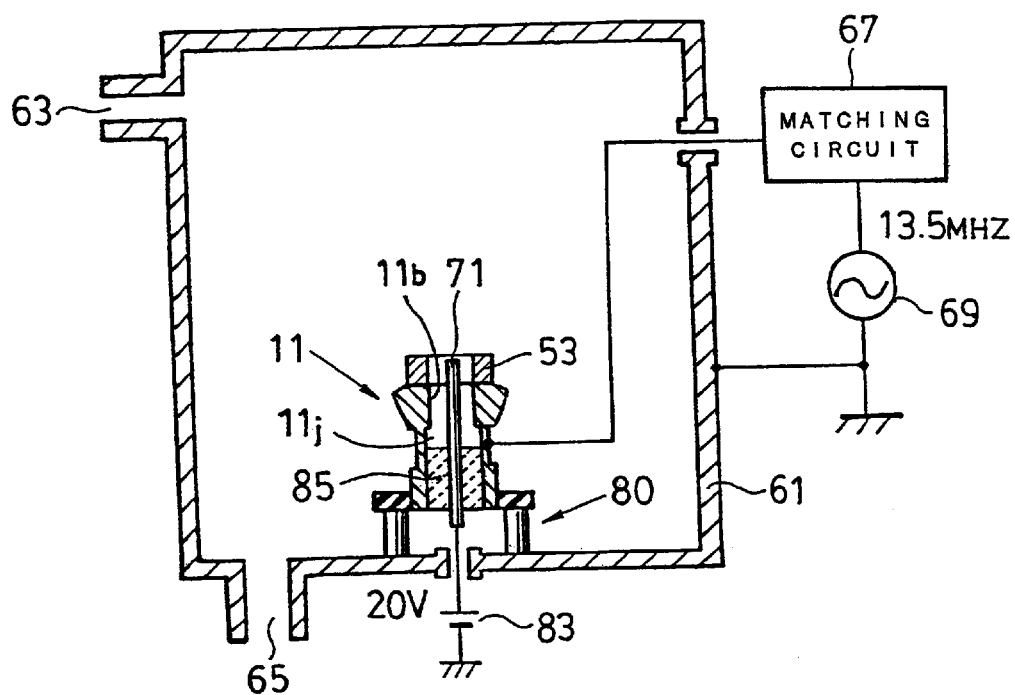
FIG. 10 is a schematic sectional view similar to FIG. 9, showing a partially modified example of the step in FIG. 7.
Figure 11:
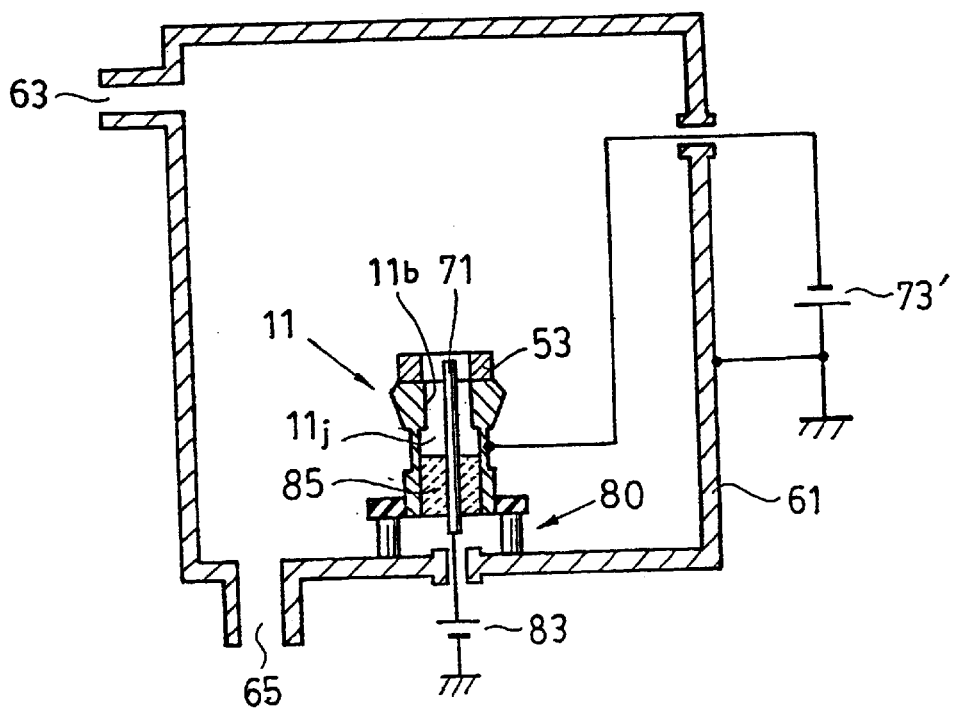
FIG. 11 is a schematic sectional view similar to FIG. 9, showing a partially modified example of the step in FIG. 8.

Thus, in the case of the examples shown in FIGS. 9 to 11, the hard carbon film is formed by applying a positive DC voltage to the electrode 71 disposed in the center of the center bore 11j of the guide bush 11. This has an effect of gathering electrons together in the peripheral region of the electrode 71, and in consequence, electron density in the peripheral region of the electrode 71 becomes higher.

When the electron density becomes higher as described, since there will naturally be a higher probability of molecules of a gas containing carbon colliding against electrons, ionization of the gas molecules is promoted, thereby increasing intensity of the plasma generated inside the center bore 11j of the guide bush 11.

As a result, the rate at which the DLC film is formed in this case becomes higher than that in the case of no positive DC voltage being applied to the electrode 71.

Further, in case that the diameter of the center bore 11j of the guide bush 11 becomes smaller and the gap dimension between the inner surface 11b thereof and the electrode 71 is reduced, an attempt to form the DLC film without applying a positive DC voltage to the electrode 71 will not succeed because no plasma is generated inside the center bore 11j, thus preventing the formation of a film.

If a positive DC voltage is applied to the electrode 71 disposed in the center bore 11j of the guide bush 11, however, it is possible to generate a plasma around the electrode 71 inside the center bore 11j by forcing electrons to gather in the peripheral region of the electrode 71, so that the DLC film can be formed on the inner surface 11b.

Other operational effects are similar to that for the other examples previously described with reference to FIGS. 6 to 8, and therefore, description thereof is omitted.

With reference to the methods of forming the DLC film described in the foregoing, the examples wherein methane gas or benzene gas as a gas containing carbon is introduced have been described, however, other gases containing carbon such as ethylene and vapor evaporated from a liquid containing carbon such as hexane may also be used.

Further, with reference to the methods of forming the DLC film described above, the embodiments wherein the DLC film is formed both on the outer periphery of the guide bush 11 and on the inner surface 11b thereof have been described, however, it is possible to form the DLC film on the inner surface 11b only.

In such a case, the DLC film may be formed by adopting a method of disposing a covering member in such a way as to cover the outer periphery of the guide bush 11 or simply by winding aluminum foil around the outer periphery of the guide bush 11.

Furthermore, with reference to the methods of forming the DLC film described above, the formation of the DLC film with the dummy member 53 disposed on the open end face of the guide bush 11 has been described.

If the quality of the DLC film formed in the region in close proximity of the open end face is not so different from that in other regions, however, the DLC film may be formed without disposing the dummy member 53 on the open end face of the guide bush 11.

A Method of Forming an Intermediate Layer: FIG. 13

Next, in the case where the DLC film 15 is formed on the surface of the cemented carbide alloy 12 fixedly attached to the inner surface 11b of the guide bush 11 with the intermediate layer 14 interposed therebetween as previously described with reference to FIGS. 4 and 5, a method of forming the intermediate layer is described hereinafter with reference to FIG. 13.

As shown in FIG. 13, in a step of forming the intermediate layer, a target receptacle 96 is installed inside a vacuum vessel 91, close to a sidewall 91a thereof, and a target 90 made of a constituent material of the intermediate layer, for example, an alloy composed of tungsten and carbon mixed together at a ratio of 1 to 1, is disposed in the target receptacle 96.

And the guide bush 11 is placed inside a vacuum vessel 91 having a gas inlet port 93 and a gas outlet port 95 such that the open end face of the guide bush 11 is disposed opposite to the target 90. At this point in time, the guide bush 11 is disposed such that the longitudinal direction of the center bore 11j of the guide bush 11 is perpendicular to the surface of the target 90.

As shown in FIG. 4, with the guide bush 11, the cemented carbide alloy 12 containing cobalt is fixedly attached to the inner surface 11b of the base member, and cobalt contained in the surface has been removed by etching.

The guide bush 11 covered by foil 94 is connected to a DC power source 92, and the target 90 is connected to a target power source 97. And the regions, however, the DLC film may be formed without disposing the dummy member 53 on the open end face of the guide bush 11.

Thereafter, argon gas (Ar) as a sputtering gas is introduced into the vacuum vessel 91 through the gas inlet port 93, adjusting degree of vacuum therein to be at $3\times10^{-3}$ torr.

Subsequently, a negative DC voltage at −50V is applied to the guide bush 11 from the DC power source 92, and a DC voltage in the rage of −500 to −600V is applied to the target 90 from the target power source 97.

Thereupon, a plasma is generated inside the vacuum vessel 91, and the surface of the target 90 is sputtered by ions of the plasma.

Atoms of tungsten and carbon, respectively, ejected from the surface of the target 90 are deposited on the inner surface 11b of the guide bush 11, thereby forming the intermediate layer 14, made up of a tungsten carbide film, on the inner surface of the cemented carbide alloy 12 of the guide bush 11. The intermediate layer 14, made up of the tungsten carbide film, is formed to a thickness in the order of 0.5 $\mu$m.

With the use of any of the methods of forming the DLC film previously described with reference to FIGS. 6 to 11 after forming the intermediate layer 14 over the cemented carbide alloy 12 as described above, the DLC film can be formed over the intermediate layer 14 with excellent adhesiveness.

The intermediate layer 14 can also be formed as a laminated layer made up of a plurality of films. In the case where the first intermediate layer 14a is made up of a titanium film or a chromium film, and the second intermediate layer 14b is made up of a silicon film or a germanium film as shown in FIG. 5, a method of forming the intermediate layers is described hereinafter.

In this case, the target 90 made of titanium or chromium is placed in the vacuum vessel 91 shown in FIG. 13, and the guide bush 11 is disposed opposite to the target 90. Subsequently, as described above, a negative DC voltage at −50V is applied to the guide bush 11 from the DC power source 92, and a negative DC voltage in the range of −500 to −600V is applied to the target 90 from the target power source 97.

Thereafter, by use of a sputtering method using argon (Ar) as a sputtering gas, titanium atoms or chromium atoms are ejected out of the target 90, thereby forming the first intermediate layer 14a (refer to FIG. 5), made up of a titanium film or a chromium film, on the surface of the cemented carbide alloy 12 attached to the inner surface 11b of the guide bush 11.

Subsequently, if the formation of another film is carried out under the same conditions as those for forming the first intermediate layer 14a except that the target 90 is replaced with one made of silicon or germanium, the second intermediate layer 14b, made up of a silicon film or a germanium film, can be formed on the surface of the first intermediate layer 14a.

Any of the methods of forming the DLC film previously described with reference to FIGS. 6 to 11 can be adopted for a method of forming the DLC film over the second intermediate layer 14b, and by doing so, the DLC film 15 can be formed over the second intermediate layer 14b with excellent adhesiveness.

Further, for the formation of the second intermediate layer 14b, an alloy containing carbon such as silicon carbide (SiC) or tungsten carbide (WC) can be used as a constituent material for the target instead of silicon or germanium, thereby forming the layer in the vacuum vessel 91 shown in FIG. 13 by means of the sputtering method Since a silicon carbide (SiC) film or a tungsten carbide (WC) film has substantially the same function as that of a silicon (Si) film or a germanium (Ge) film, the silicon carbide (SiC) film or the tungsten carbide (WC) film, when used for the second intermediate layer 14b, has substantially the same advantageous effect as that of the silicon (Si) film or the germanium (Ge) film.

What is claimed is:

1. A method of forming a diamond-like carbon film on a guide bush substantially in a cylindrical shape, having a center bore penetrating through an entire length thereof along a longitudinal axial direction comprising:

an outer taper surface and slots for providing elasticity thereto, formed at one end thereof in the longitudinal axial direction;

a threaded section formed at the other end thereof for being attached into a column of an automatic lathe; and an inner surface for holding a workpiece, formed at an inner radius of a portion where the other taper surface is formed, wherein the workpiece inserted in the center bore is held by the inner surface rotatably and slidably in the longitudinal axial direction in close proximity of a cutting tool, when the guide bush is attached to the automatic lathe, and the inner surface is provided with a cemented carbide alloy containing at least cobalt, said method comprising:

a step of removing cobalt contained in the surface of the cemented carbide alloy by etching and removing also marks caused by a grinding process;

a step of forming an intermediate layer made of a constituent material of a target on the surface of the cemented carbide alloy by means of a sputtering method after placing the guide bush and the target in a vacuum vessel such that the center bore of the guide bush is disposed opposite to the target, and evacuating the vacuum vessel before introducing argon gas thereinto;

a step of disposing the guide bush with the intermediate layer formed thereon in the vacuum vessel such that an electrode is inserted inside the center bore thereof; and a step of forming the diamond-like carbon film on the surface cemented carbide alloy formed on the inner surface of the guide bush by evacuating the vacuum vessel before introducing a gas containing carbon therein, and causing a plasma to be generated inside the center bore by applying a DC voltage of RF electric power to the guide bush while keeping the electrode grounded.

2. A method of forming a diamond-like carbon film on a guide bush according to claim 1, wherein in the step of removing cobalt contained in the surface of the cemented carbide alloy by etching, cobalt is removed by wet etching.

3. A method of forming a diamond-like carbon film on a guide bush according to claim 2, wherein the wet etching is executed in a blended solution of sodium hydroxide and aqueous hydrogen peroxide.

4. A method of forming a diamond-like carbon film on a guide bush according to claim 1, wherein in the step of forming the intermediate layer, an alloy composed of tungsten and carbon mixed together at a ratio of 1 to 1 is used as a constituent material for said target, and the intermediate layer made up of a tungsten carbide film is formed on the surface of the cemented carbide alloy.

5. A method of forming a diamond-like carbon film on a guide bush according to claim 1, wherein in the step of forming the intermediate layer, a first intermediate layer made up of a titanium film or a chromium film is formed on the surface of the cemented carbide alloy by using titanium or chromium as a constituent material of the target before forming a second intermediate layer made up of a silicon film or a germanium film over said first intermediate layer by replacing the constituent material of the target with silicon or germanium.

6. A method of forming a diamond-like carbon film on a guide bush according to claim 1, wherein in the step of forming the DLC film on the surface of said intermediate layer formed on the inner surface of the guide bush, the gas containing carbon, introduced into the vacuum vessel, is benzene or methane.

7. A method of forming a diamond-like carbon film on a guide bush substantially in a cylindrical shape, having a center bore penetrating through an entire length thereof along a longitudinal axial direction comprising:
    an outer taper surface and slots for providing elasticity thereto, formed at one end thereof in the longitudinal axial direction;
    a threaded section formed at the other end thereof for being attached into a column of an automatic lathe; and
    an inner surface for holding a workpiece, formed at an inner radius of a portion where the other taper surface is formed, wherein the workpiece inserted in the center bore is held by the inner surface rotatably and slidably in the longitudinal axial direction in close proximity of a cutting tool, when the guide bush is attached to the automatic lathe, and the inner surface is provided with a cemented carbide alloy containing at least cobalt, said method comprising:
    a step of removing cobalt contained in the surface of the cemented carbide alloy by etching and removing also marks by a grinding process;
    a step of forming an intermediate layer made of a constituent material of a target on the surface of the cemented carbide alloy by means of a sputtering method after placing the guide bush and the target in a vacuum vessel such that the center bore of the guide bush is disposed opposite to the target, and evacuating the vacuum vessel before introducing argon gas thereinto;
    a step of disposing the guide bush with the intermediate layer formed thereon in the vacuum vessel such that an electrode is inserted inside the center bore thereof; and
    a step of forming the diamond-like carbon film on the surface cemented carbide alloy formed on the inner surface of the guide bush by evacuating the vacuum vessel before introducing a gas containing carbon therein, and causing a plasma to be generated inside the center bore by applying a DC voltage of RF electric power to the guide bush while applying a positive DC voltage to the electrode.

8. A method of forming a diamond-like carbon film on a guide bush according to claim 7, wherein in the step of removing cobalt contained in the surface of the cemented carbide alloy by etching, cobalt is removed by wet etching.

9. A method of forming a diamond-like carbon film on a guide bush according to claim 8, wherein the wet etching is executed in a blended solution of sodium hydroxide and aqueous hydrogen peroxide.

10. A method of forming a diamond-like carbon film on a guide bush according to claim 7, wherein in the step of forming the intermediate layer, an alloy composed of tungsten and carbon mixed together at a ratio of 1 to 1 is used as a constituent material for said target, and the intermediate layer made up of a tungsten carbide film is formed on the surface of the cemented carbide alloy.

11. A method of forming a diamond-like carbon film on a guide bush according to claim 7, wherein in the step of forming the intermediate layer, a first intermediate layer made up of a titanium film or a chromium film is formed on the surface of the cemented carbide alloy by using titanium or chromium as a constituent material of the target before forming a second intermediate layer made up of a silicon film or a germanium film over said first intermediate layer by replacing the constituent material of the target with silicon or germanium.

12. A method of forming a diamond-like carbon film on a guide bush according to claim 7, wherein in the step of forming the DLC film on the surface of said intermediate layer formed on the inner surface of the guide bush, the gas containing carbon, introduced into the vacuum vessel, is benzene or methane.

* * * * *